United States Patent
Kang et al.

(10) Patent No.: US 11,796,923 B2
(45) Date of Patent: Oct. 24, 2023

(54) OVERLAY CORRECTION METHOD, METHOD OF EVALUATING OVERLAY CORRECTION OPERATION, AND METHOD OF FABRICATING SEMICONDUCTOR DEVICE USING THE OVERLAY CORRECTION METHOD

(71) Applicant: Samsung Electronics Co., Ltd., Suwon-si (KR)

(72) Inventors: Hyunjay Kang, Hwaseong-si (KR); Chorong Park, Seongnam-si (KR); Doogyu Lee, Ansan-si (KR); Seungyoon Lee, Seoul (KR); Jeongjin Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 219 days.

(21) Appl. No.: 17/392,788

(22) Filed: Aug. 3, 2021

(65) Prior Publication Data
US 2022/0179302 A1  Jun. 9, 2022

(30) Foreign Application Priority Data
Dec. 3, 2020 (KR) ........................ 10-2020-0167294

(51) Int. Cl.
*G03F 7/20* (2006.01)
*G03F 7/00* (2006.01)
*G03F 1/70* (2012.01)

(52) U.S. Cl.
CPC ........ *G03F 7/70633* (2013.01); *G03F 7/2004* (2013.01); *G03F 1/70* (2013.01)

(58) Field of Classification Search
CPC ....... G03F 1/70; G03F 7/2004; G03F 7/70633
USPC ................................................ 430/5, 22, 30
See application file for complete search history.

(56) References Cited

U.S. PATENT DOCUMENTS

| | | | |
|---|---|---|---|
| 5,308,991 A | 5/1994 | Kaplan | |
| 6,813,001 B2 | 11/2004 | Fujisawa et al. | |
| 8,785,112 B2 | 7/2014 | Hotzel | |
| 9,442,391 B2 | 9/2016 | Hsieh et al. | |
| 2019/0113838 A1 | 4/2019 | Jung et al. | |

FOREIGN PATENT DOCUMENTS

| | | | |
|---|---|---|---|
| KR | 10-2002-0094503 A | 12/2002 | |
| KR | 10-2012-0093723 A | 8/2012 | |

*Primary Examiner* — Christopher G Young
(74) *Attorney, Agent, or Firm* — Harness, Dickey & Pierce, P.L.C.

(57) ABSTRACT

Disclosed are an overlay correction method, a method of evaluating an overlay correction operation, and a method of fabricating a semiconductor device using the overlay correction method. The overlay correction method may include measuring an overlay between center lines of lower and upper patterns on a wafer, fitting each of components of the overlay with a polynomial function to obtain first fitting quantities, and summing the first fitting quantities to construct a correction model. The components of the overlay may include overlay components, which are respectively measured in two different directions parallel to a top surface of a reticle. The highest order of the polynomial function may be determined as an order, which minimizes a difference between the polynomial function and each of the components of the overlay or corresponds to an inflection point in a graph of the difference with respect to the highest order of the polynomial function.

20 Claims, 22 Drawing Sheets

OVERLAY CORRECTION METHOD, METHOD OF EVALUATING OVERLAY CORRECTION OPERATION, AND METHOD OF FABRICATING SEMICONDUCTOR DEVICE USING THE OVERLAY CORRECTION METHOD

CROSS-REFERENCE TO RELATED APPLICATIONS

This U.S. non-provisional patent application claims priority under 35 U.S.C. § 119 to Korean Patent Application No. 10-2020-0167294, filed on Dec. 3, 2020, in the Korean Intellectual Property Office, the entire contents of which are hereby incorporated by reference.

BACKGROUND

Some example embodiments relate to a method of fabricating a semiconductor device, and in particular, to an overlay correction method, a method of evaluating an overlay correction operation, and/or a method of fabricating a semiconductor device using the overlay correction method.

As an integration density of a semiconductor device increases, demand for high resolution lithography systems is increasing. Thus, an extreme ultraviolet (EUV) exposure system, in which an EUV light having a shorter wavelength than a deep ultraviolet (DUV) light, is used as a source light, is being actively developed. A reflection-type mask reflecting the EUV light is used for the EUV exposure system.

Meanwhile, an overlay measurement process is performed to obtain information on distortion between a lower pattern and an upper pattern, which are sequentially formed on a substrate. In the overlay measurement process, overlay quantities may be obtained from several positions on the substrate. Magnitudes and/or values of the overlay quantities may vary depending on their measurement positions. To fabricate a semiconductor device using the EUV exposure system, it is necessary/desirable to more precisely correct or accommodate the overlay quantities.

SUMMARY

Some example embodiments provide an overlay correction method capable of correcting components of terms of higher order, a method of evaluating an overlay correction operation, and/or a method of fabricating a semiconductor device using the overlay correction method.

According to some example embodiments, an overlay correction method may include measuring an overlay between a center line of a lower pattern on a wafer and a center line of an upper pattern on the lower pattern, fitting each of components of the overlay with a polynomial function to obtain first fitting quantities, and summing the first fitting quantities to construct a correction model. The components of the overlay include overlay components in a first direction parallel to a top surface of a reticle, and overlay components in a second direction parallel to the top surface of the reticle and intersecting the first direction, and at least one of a degree of the polynomial function corresponds to an order which minimizes an absolute value of a difference between the polynomial function and each of the components of the overlay, or the degree of the polynomial function corresponds to an inflection point in a graph of the difference with respect to the degree of the polynomial function.

According to some example embodiments, a method of evaluating an overlay correction operation may include measuring overlays between lower patterns and upper patterns of each of a plurality of wafers, the lower patterns formed on the wafers by using a plurality of first fabrication processes, the upper patterns formed on the lower patterns by a plurality of second fabrication processes, fitting components of each of the overlays with a polynomial function to obtain first fitting quantities and construct correction models, calculating a measure of central tendency for the correction models, subtracting the measure of central tendency from each of the correction models, and determining whether each of the correction models is applicable to a pair of fabrication processes, which are respectively chosen from the first fabrication processes and the second fabrication processes. The examining of the correction models comprises comparing values, respectively obtained by subtracting the measure of central tendency from the correction models, and the components of each of the overlays comprise overlay components in a first direction parallel to a top surface of a reticle provided in each of the fabrication processes, and overlay components in a second direction parallel to the top surface of the reticle and intersects the first direction.

According to some example embodiments, a method of fabricating a semiconductor device may include preparing a first wafer including a first lower pattern and a first upper pattern, which are formed using a first fabrication process and a second fabrication process, respectively, measuring an overlay between the first lower pattern and the first upper pattern, the measuring on the first wafer, fitting each of components of the overlay with a polynomial function to obtain first fitting quantities, summing the first fitting quantities to construct a correction model, manufacturing a reticle based on the correction model, and forming a second lower pattern on a second wafer and a second upper pattern on the second wafer, the second lower pattern and the second upper patterned formed using the reticle. The components of the overlay comprise overlay components in a first direction parallel to a top surface of the reticle, and overlay components in a second direction parallel to the top surface of the reticle and intersecting the first direction.

DETAILED DESCRIPTION OF SOME EXAMPLE EMBODIMENTS

Some example embodiments of the inventive concepts will now be described more fully with reference to the accompanying drawings, in which example embodiments are shown.

Figure 1:
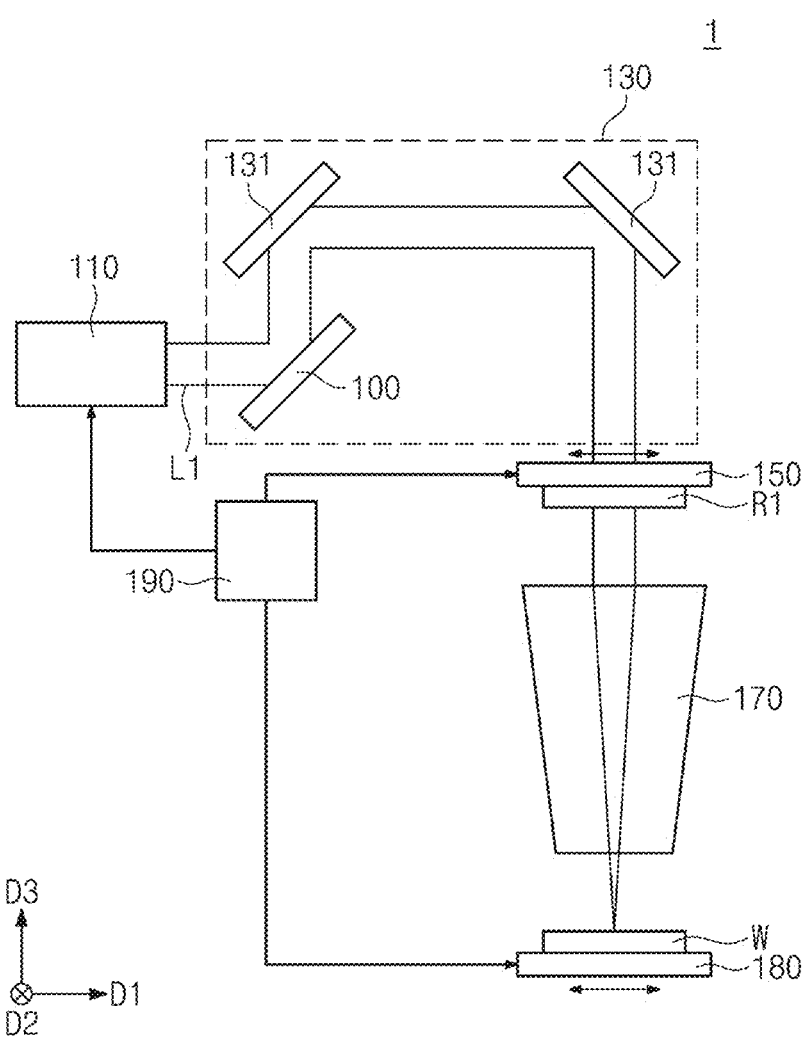
FIGS. 1 and 2 are schematic sectional views illustrating semiconductor device fabrication systems, which are used to fabricate a semiconductor device according to some example embodiments of inventive concepts.
Figure 2:
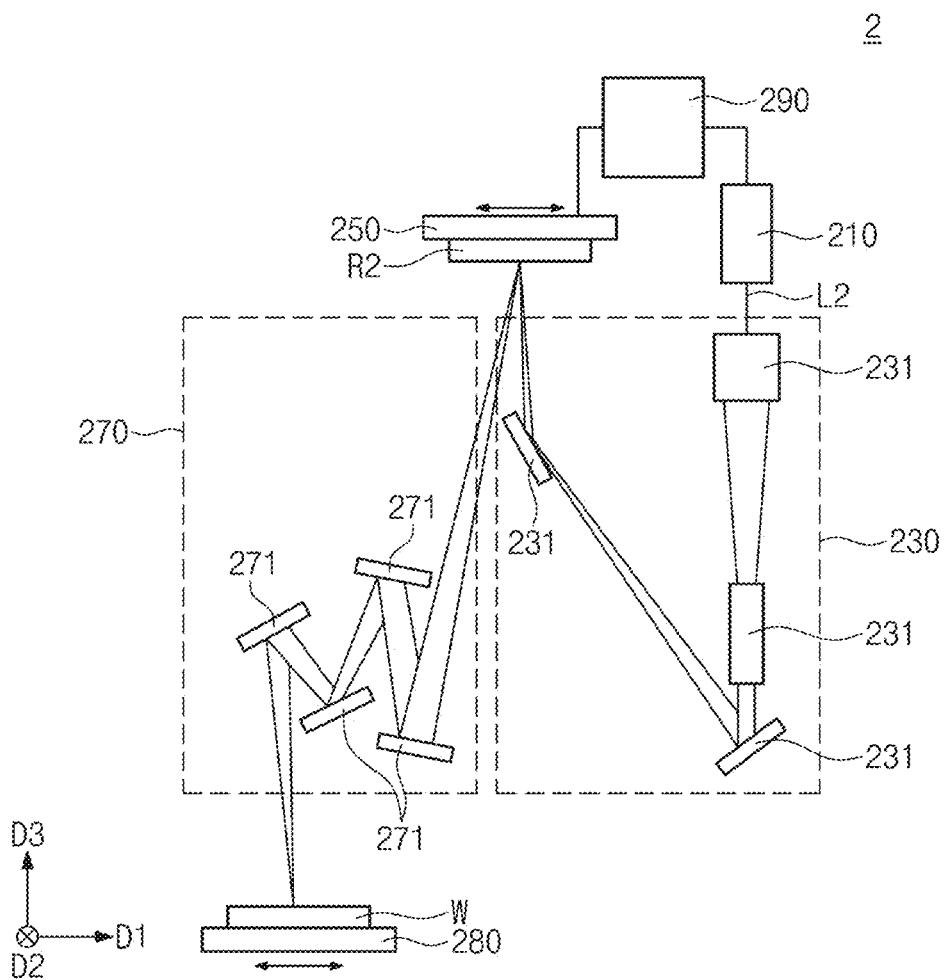

FIGS. 1 and 2 are schematic sectional views illustrating semiconductor device fabrication systems, which are used to fabricate a semiconductor device according to some example embodiments of inventive concepts.

In detail, FIG. 1 illustrates a first fabrication system 1, which is used to fabricate a semiconductor device according to some example embodiments of inventive concepts, and FIG. 2 illustrates a second fabrication system 2, which is used to fabricate a semiconductor device according to some example embodiments of inventive concepts.

Referring to FIG. 1, the first fabrication system 1 may include a light source part 110, a delivery part 130, a projection part 170, and a control part 190. The light source part 110 may include, for example, a laser light source which emits light whose center wavelength ranges from about 150 nm to 500 nm. For example, the light source part 110 may include a laser light source, which is configured to emit at least one of a G-line, I-line, KrF, ArF, or $F_2$ laser. In some example embodiments, the light source part 110 may include an ArF laser light source, which is configured to emit light having a center wavelength of about 193 nm.

The delivery part 130 may be configured to deliver a first light L1, which is generated by the light source part 110, to/onto a first reticle R1. The delivery part 130 may include a plurality of optical devices 131, which are provided to guide the first light L1 to the first reticle R1, and the optical devices 131 may include a lens and/or a mirror and/or a partial mirror.

The first reticle R1 may be provided on a reticle stage 150. The first reticle R1 may be, for example, a transmission-type mask. Although not shown, the first reticle R1 may be fastened to the reticle stage 150 by, for example, at least three clamps, which are placed at an edge of the first reticle R1. The reticle stage 150 may be formed of or may include a material that is transparent to the first light L1.

The projection part 170 may be configured to concentrate/focus the first light L1, which passes through the reticle stage 150 and the first reticle R1, to a region of a wafer W. In some example embodiments, the projection part 170 may include a plurality of focusing lenses. The focusing lenses of the projection part 170 may be configured to project the first light L1, which passes through the first reticle R1, to the wafer W in a reduction manner (e.g., by one of 4, 6, or 8 times).

The wafer W may be provided on a wafer stage 180. The wafer W may be a semiconductor wafer, on which an integrated circuit is formed, and which is formed of at least one of, for example, silicon, germanium, silicon germanium, or compound semiconductor materials, which may be doped or undoped and which may be single-crystalline polycrystalline phase. A top surface of the wafer W may be coated with a photoresist material, which is sensitive to the first light L1. A diameter of the wafer W may be 300 mm; however, example embodiments are not limited thereto, and the diameter of the wafer W may be more than, or less than, 300 mm.

Photoresist patterns may be formed by developing a photoresist material on a surface of the wafer W, which is exposed by the first light L1. Mask patterns may be formed by patterning mask layers, which are located below/under the photoresist patterns, using the photoresist patterns as an etch mask. Target layers, which are located below the mask patterns, may be patterned using the mask patterns as an etch mask (e.g. as a hard mask), and thus, target patterns having desired shapes may be formed on the wafer W.

The control part 190 may be connected to the light source part 110, the reticle stage 150, and the wafer stage 180, and may be used to control them. For example, the control part 190 may control driving motors, which are respectively coupled to the reticle stage 150 and the wafer stage 180. The reticle stage 150 and the wafer stage 180 may be moved in a first and/or second direction D1 or D2 by the driving motors.

The first direction D1 may be a direction that is parallel to a top surface of the first reticle R1, and the second direction D2 may be a direction that is parallel to the top surface of the first reticle R1 but is not parallel to the first direction D1. As an example, the first direction D1 and the second direction D2 may be orthogonal to each other; however, example embodiments are not limited thereto. For example, the first direction D1 may be an extension direction of a slit defining a region to be exposed by the first light L1, and the second direction D2 may be a scan direction or a movement direction of the slit; however, example embodiments are not limited thereto. Alternatively or additionally, each of or either of the reticle stage 150 and the wafer stage 180 may be rotated in a clockwise and/or counterclockwise direction by the driving motor.

Referring to FIG. 2, the second fabrication system 2 may include a light source part 210, a delivery part 230, a projection part 270, and a control part 290. The light source part 210 may include a light source which emits light whose center wavelength ranges from, for example, about 4 nm to about 120 nm, and in particular, from about 4 nm to about 20 nm. As an example, the light source part 210 may include an extreme ultraviolet (EUV) light source which emits light having a center wavelength of about 13.5 nm. A second light L2, which is generated by the light source part 210, may have an energy of about 6.21 eV to 124 eV or, in particular, about 90 eV to 95 eV.

The light source part 210 of the second fabrication system 2 may include, for example, a light source using laser produced plasma (LPP). Although not shown, the light source part 210 of the second fabrication system 2 may include a seed laser generating a pulsed laser light, at least one power amplifier amplifying the laser light, and a vacuum chamber, in which a target generation apparatus generating targets with a specific (or, alternatively, predefined) period and a target retrieving apparatus retrieving the targets are provided.

In some example embodiments, the targets may be formed of or may include at least one of materials (e.g., tin (Sn), lithium (Li), or xenon (Xe)), which emit an extreme ultraviolet light when the material is in a plasma state. In the case where the targets include tin (Sn), the targets may be formed of or include at least one of pure tin (Sn), tin compounds (e.g., $SnBr_4$, $SnBr_2$, $SnH_4$, and so forth), or tin alloys (e.g., tin-gallium alloy, tin-indium alloy, tin-indium-gallium alloy, and so forth). The targets may be provided in the form of, for example, at least one of a droplet, a stream, or a cluster.

The pulsed laser light, which is generated using the seed laser and passes through the amplifier, may be irradiated onto the targets, which are moving from the target generation apparatus toward the target retrieving apparatus, and in this case, plasma may be formed from a portion of the targets, thereby emitting extreme ultraviolet light (e.g., the second light L2).

The delivery part 230 may be configured to deliver the second light L2, which is generated by the light source part 210, to a second reticle R2. The delivery part 230 may include a plurality of optical devices 231, which are provided to guide the second light L2 to the second reticle R2, and in some example embodiments, the optical devices 231 may include a lens and/or a mirror. The optical devices 231 of the delivery part 230 may be provided to allow the second light L2 to be slantingly incident to the second reticle R2.

The second reticle R2 may be provided on a reticle stage 250. For example the reticle stage 250 may be configured to support the second reticle R2. In some example embodiments, the second reticle R2 may be or may include a reflection-type mask. Although not shown, the second reticle R2 may be fastened to the reticle stage 250 by, for example, a plurality of clamps, which are placed with a specific distance on the entire rear surface of the second reticle R2. The reticle stage 250 may be formed of or include a material which reflects the second light L2 generated by the light source part 210.

The projection part 270 may be configured to deliver the second light L2, which is reflected from the reticle stage 250 and the second reticle R2, to a region of the wafer W. The projection part 270 may include a plurality of optical devices 271, which are configured to guide the second light L2 to the region of the wafer W, and in some example embodiments, the optical devices 271 may include a lens and/or a mirror and/or a half-mirror. The optical devices 271 of the projection part 270 may be configured to project the second light L2, which is reflected from the second reticle R2, to the wafer W in a reduction manner (e.g., by 4, 6, or 8 times).

The wafer W may be provided on a wafer stage 280. For example, the wafer stage 280 may be configured to support the wafer W. The wafer W in FIG. 2 may be substantially the same as the wafer W described with reference to FIG. 1. For example, the wafer W may be or may correspond to the wafer W described with reference to FIG. 1, but may have been further processed. A top surface of the wafer W may be coated with a photoresist material, which is sensitive to the second light L2. For example the photoresist material may harden and/or cross-link in the presence of the second light L2.

The photoresist material, which is sensitive to the second light L2 (e.g., the extreme ultraviolet (EUV) light having a center wavelength of about 13.5 nm), may be, for example, an organic photoresist material containing an organic polymer, such as polyhydroxystyrene. The organic photoresist material may further include a photosensitive compound, which can be optically patterned by the second light L2. The organic photoresist material may further include a material (e.g., at least one of an organometallic material, an iodine-containing material, or a fluorine-containing material) having high absorptivity to the second light L2. Additionally or alternatively, the photoresist material may be or may include an inorganic photoresist material containing an inorganic material (e.g., tin oxide).

The photoresist material may be formed to a relatively small thickness on a surface of the wafer W. Photoresist patterns may be formed by developing the photoresist material, which is exposed to the second light L2. When viewed in a plan view, each of the photoresist patterns may be formed to have a line shape extending in a specific direction such as one of D1 or D2, an island shape, a zigzag shape, a honeycomb shape, a circular shape, a polygonal shape such as a shape of a polyomino, but the shape of the photoresist pattern is not limited to these examples.

Mask patterns may be formed by patterning mask layers, which are located below/under the photoresist patterns, using the photoresist patterns as an etch mask. Target layers, which are located below the mask patterns, may be patterned using the mask patterns as an etch mask, and thus, target patterns having desired shapes may be formed on the wafer W.

In the case where the second fabrication system 2 is used, it may be possible to form fine-pitch patterns, using just one photomask, without using a multi-patterning technology (MPT). The patterns formed by the second fabrication system 2 may have a pitch such as a minimum pitch of about 45 nm or less. For example, by using the second fabrication system 2, it may be possible to realize precise and fine patterns without using the multi-patterning technology.

The control part 290 may be connected to the light source part 210, the reticle stage 250, and the wafer stage 280 and may be used to control them. For example, the control part 290 may control driving motors, which are respectively coupled to the reticle stage 250 and the wafer stage 280. The reticle stage 250 and the wafer stage 280 may be moved in the first and/or second direction D1 or D2, and/or may be rotated clockwise and/or counterclockwise, by the driving motors.

The first direction D1 may be a direction that is parallel to a top surface of the second reticle R2, and the second direction D2 may be a direction that is parallel to the top surface of the second reticle R2 but is not parallel to the first direction D1. As an example, the first direction D1 and the second direction D2 may be orthogonal to each other; however, example embodiments are not limited thereto. For example, the first direction D1 may be an extension direction of a slit defining a region to be exposed by the second light L2, and the second direction D2 may be a scan direction or a movement direction of the slit. Alternatively or additionally, each of the reticle stage 250 and the wafer stage 280 may be rotated in a clockwise or counterclockwise direction by the driving motor.

Figure 3:
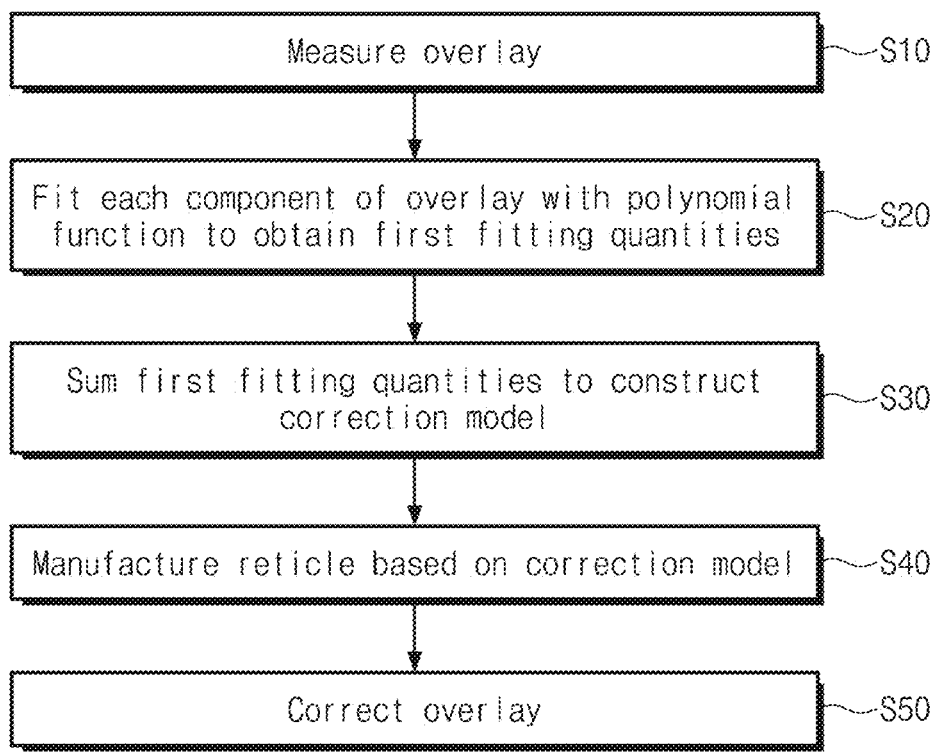
FIG. 3 is a flow chart illustrating an overlay correction method according to some example embodiments of inventive concepts.

FIG. 3 is a flow chart illustrating an overlay correction method according to some example embodiments of inventive concepts.

Referring to FIG. 3, the overlay correction method may include measuring overlays of lower patterns and upper patterns on a wafer (in S10), fitting each component of the overlay with a polynomial function to obtain first fitting quantities (in S20), summing the first fitting quantities to construct a correction model (in S30), manufacturing/fabricating a reticle based on the correction model (in S40), and correcting an overlay using the reticle which is manufactured based on the correction model (in S50).

Hereinafter, the measuring of the overlay (in S10) will be described with reference to FIGS. 4 and 5, and the fitting of each component of the overlay with the polynomial function (in S20) will be described with reference to FIGS. 7A to 7E and 8A to 8E.

Figure 4:
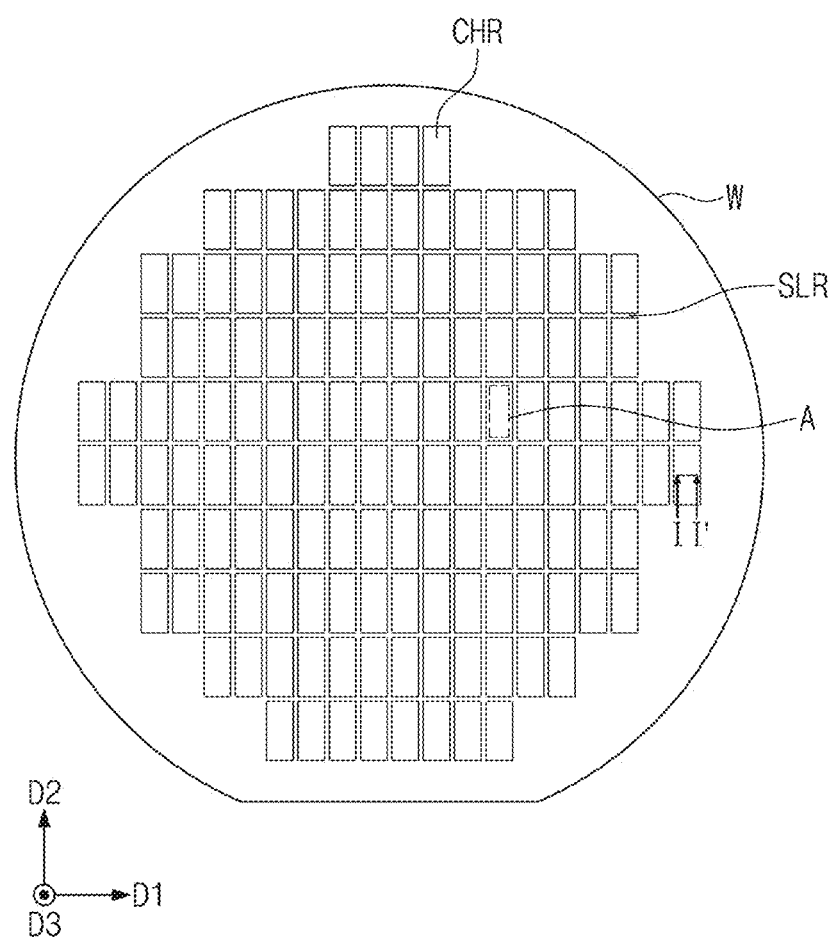
FIG. 4 is a top plan view of a wafer that is provided to illustrate a step of measuring an overlay in the overlay correction method according to some example embodiments of inventive concepts.
Figure 5:
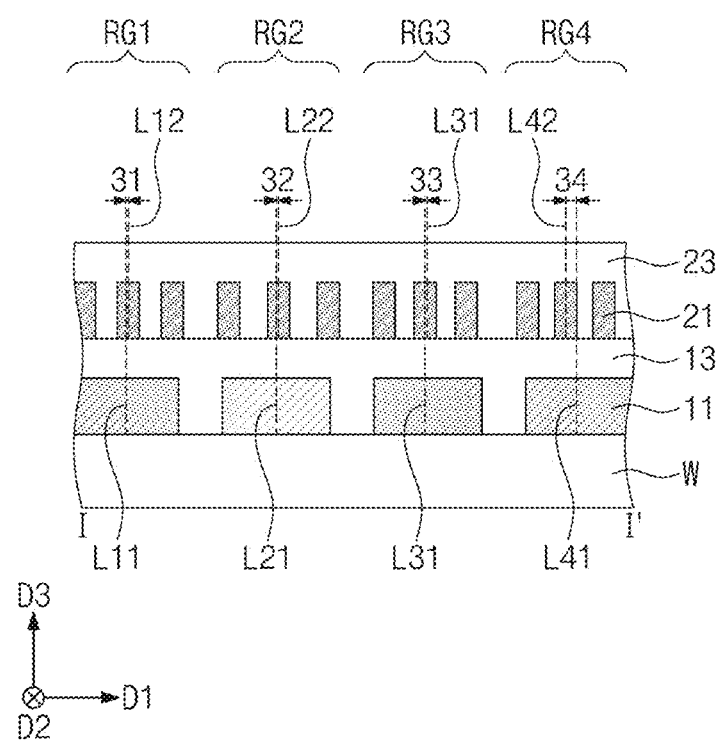
FIG. 5 is a sectional view, which is taken along a line I-I' of FIG. 4 to illustrate a step of measuring an overlay in the overlay correction method according to some example embodiments of inventive concepts.

FIG. 4 is a top plan view of a wafer that is provided to illustrate a step of measuring an overlay in the overlay correction method according to some example embodiments of inventive concepts, and FIG. 5 is a sectional view, which is taken along a line I-I' of FIG. 4 to illustrate a step of measuring an overlay in the overlay correction method according to some example embodiments of inventive concepts.

Referring to FIGS. 4 and 5, the wafer W may include a plurality of chip regions CHR and a scribe line region SLR, which is provided between the chip regions CHR. The wafer W may also include at least one of a flat region or a notch (not illustrated). An orientation of a single-crystal layer of the wafer W, and/or an impurity conductivity type of the wafer W, may be associated with the flat region and/or with the notch; however, example embodiments are not limited thereto. Referring back to FIGS. 1 and 2 along with FIGS. 4 and 5, the first and second reticles R1 and R2 may include patterns associated with one or more chip regions CHR. For example, the first reticle R1 may include patterns associated with one of the chip regions CHR, and the second reticle R2 may include other patterns associated with one of the chip regions CHR. Alternatively, each of or at least one of the first reticle R1 or the second reticle R2 may include patterns associated with more than one of the chip regions CHR.

The chip regions CHR may be arranged in the first and second directions D1 and D2 on the wafer W. Each of the chip regions CHR may be enclosed by the scribe line region SLR. In some example embodiments, some devices such as semiconductor memory devices (e.g., at least one of a dynamic random access memory (DRAM), static random access memory (SRAM), NAND FLASH memory, resistive random access memory (RRAM), and so forth) may be provided on the chip regions CHR. Alternatively or additionally in some example embodiments, a micro-electro mechanical system (MEMS) device, an optoelectronic device, or a processor (e.g., CPU and/or DSP) may be provided on the chip regions CHR. In some example embodiments, standard cells including semiconductor elements, such as OR gates or AND gates, may be provided on the chip regions CHR. Redistribution chip pads, which are used for data and/or signal input/output operations on semiconductor integrated circuits, and/or redistribution pads, which are used to for signal input/output operations on test circuits, may be connected to each of the chip regions CHR. Furthermore although FIG. 4 illustrates a specific number of chip regions CHR as not extending to the edge of the wafer W, example embodiments are not limited thereto. Still further although FIG. 4 illustrates that each chip region CHR is rectangular, example embodiments are not limited thereto. For example, each chip region CHR may be square. Furthermore there may be chip regions included on the wafer W that are larger than other chip regions CHR included on the wafer, which may be used for testing purposes; however, example embodiments are not limited thereto.

The scribe line region SLR may be extended in the first direction D1 and the second direction D2, between the chip regions CHR. Although not shown, the scribe line region SLR may include a cutting region, which is cut by a sawing or dicing machine, and edge regions, which are provided between the cutting region and the chip regions CHR. The scribe line region SLR may include other components, such as test components such as components to measure electrical properties of various transistors and/or vias and/or contacts and/or metal lines; however, example embodiments are not limited thereto.

Lower patterns 11 and upper patterns 21 may be provided on the chip regions CHR of the wafer W. The lower patterns 11 may be provided on the top surface of the wafer W, and a lower insulating layer 13 may be provided to cover the lower patterns 11. The upper patterns 21 may be provided on the lower insulating layer 13, and an upper insulating layer 23 may be provided to cover the upper patterns 21. A pitch of the upper patterns 21 may be smaller than a pitch of the lower patterns 11, e.g. a pitch of the upper patterns 21 may be half as much, or a third as much, or a fourth as much, as a pitch of the lower patterns 11. In some example embodiments, the lower patterns 11 may be formed by the first fabrication system 1 described with reference to FIG. 1, and the upper patterns 21 may be formed by the second fabrication system 2 described with reference to FIG. 2. Each of the lower and upper patterns 11 and 21 is illustrated to be an embossed pattern, but inventive concepts are not limited to this example. For example, each of the lower and upper patterns 11 and 21 may be an engraved pattern.

In some example embodiments, the lower patterns 11 may be provided on first to fourth regions RG1 to RG4 of the wafer W, respectively. Furthermore, in some example embodiments, three upper patterns 21 may be provided on each of the first to fourth regions RG1 to RG4, but the number of the upper patterns 21 provided on each of the first to fourth regions RG1 to RG4 is not limited to this example.

A center line of the lower pattern 11 provided on the first region RG1 will be referred to as a first lower center line L11, a center line of the upper patterns 21 provided on the first region RG1 will be referred to as a first upper center line L12. An extent of misalignment between the first lower center line L11 and the first upper center line L12 and/or a displacement vector between the center lines will be referred to as a first overlay quantity 31.

A second overlay quantity 32, a third overlay quantity 33, and a fourth overlay quantity 34 may be defined for the second region RG2, the third region RG3, and the fourth region RG4, respectively, in the same manner. Each of the first to fourth overlay quantities 31 to 34 may be or correspond to a vector quantity having two components in the first and second directions D1 and D2.

In a case where the lower patterns 11 and the upper patterns 21 are formed using different fabrication systems such as a first fabrication system using DUV light and a second fabrication system using EUV light, the first to fourth overlay quantities 31 to 34 may be non-vanishing, e.g. may be significant. For example, the first and second fabrication systems 1 and 2 of FIGS. 1 and 2, which may respectively used to form the lower patterns 11 and the upper patterns 21, may have different properties from each other, and in this case, the first to fourth overlay quantities 31 to 34 may be non-vanishing e.g. may be significant.

For example, referring back to FIGS. 1 and 2, the clamps fastening the first reticle R1 of the first fabrication system 1 may be placed at the edge region of the first reticle R1, whereas the clamps fastening the second reticle R2 of the second fabrication system 2 may be placed with a specific distance on the entire rear surface of the second reticle R2. Due to not only this difference associated with the clamps but also a difference in hardware and/or software between the first and second fabrication systems 1 and 2 (in particular, between the projection parts 170 and 270), the first to fourth overlay quantities 31 to 34 may be non-vanishing, e.g. may be significant.

Figure 6:
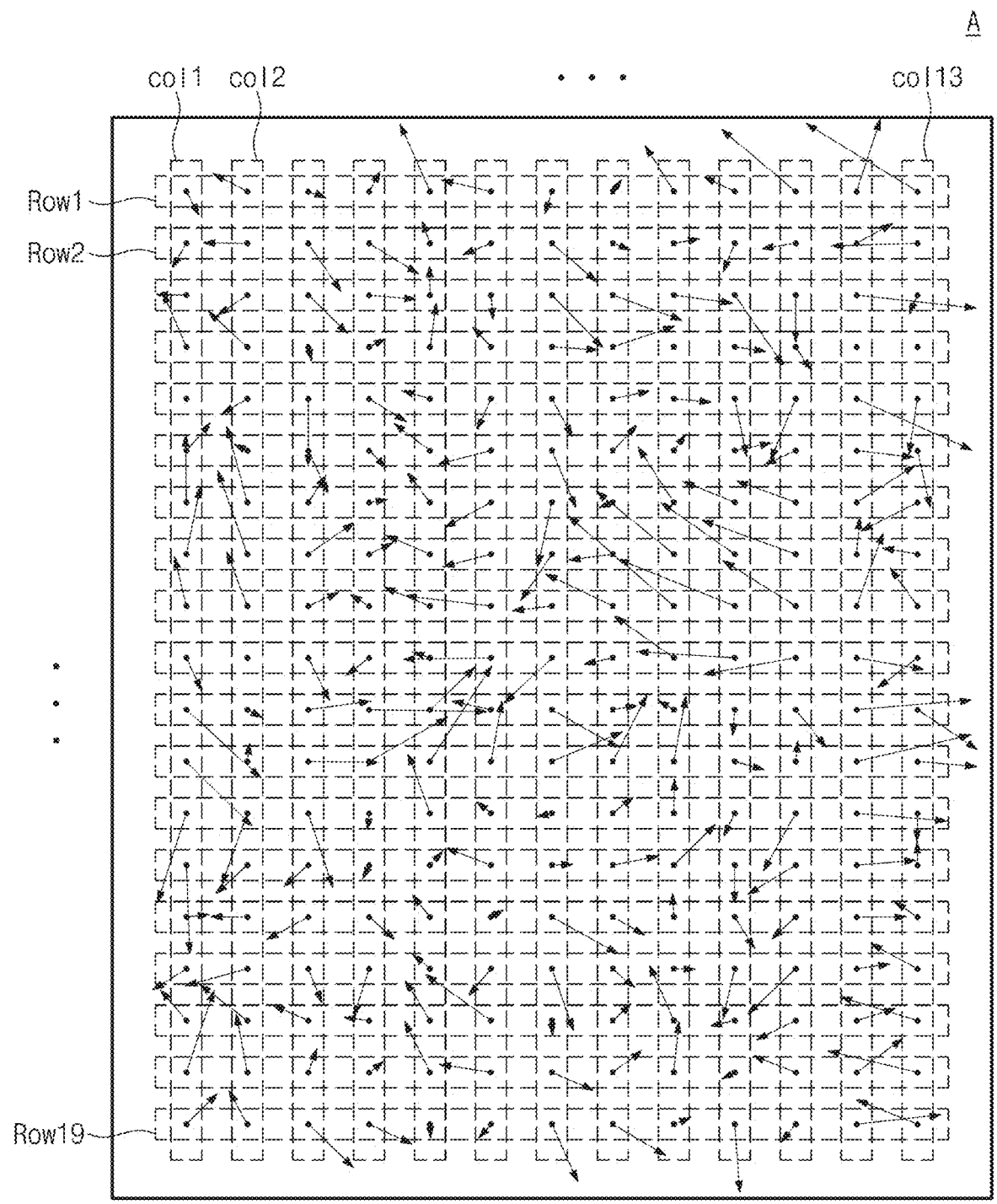
FIG. 6 is a diagram illustrating overlay quantities, which are measured from a region A of FIG. 4 by the overlay correction method according to some example embodiments of inventive concepts.

FIG. 6 is a diagram illustrating overlay quantities, which are measured from a region A of FIG. 4 by the overlay correction method according to some example embodiments of inventive concepts. The region A may be or may correspond to one or more of the chip regions CHR. Alternatively or additionally the region A may be or may correspond to one of the scribe regions SLR.

In FIG. 6, the region A is illustrated to have 19 rows Row1-Row19 and 13 columns Col1-Col13. Hereinafter, the overlay correction method may be described with reference to the region A, but the numbers of rows and/or the number of columns in the region A are not limited to this example.

The arrows in FIG. 6 represent overlay quantities measured from intersection regions of the 19 rows Row1-Row19 and the 13 columns Col1-Col13. The length of the arrow represents a magnitude of the overlay quantity, and the direction of the arrow represents a direction of the overlay quantity. For example, each of the arrows in FIG. 6 corresponds to a vector.

FIGS. 7A to 7E and 8A to 8E are diagrams that are provided to illustrate a step of fitting each of overlay components with a polynomial function, in the overlay correction method according to some example embodiments of inventive concepts.

Figure 7A:
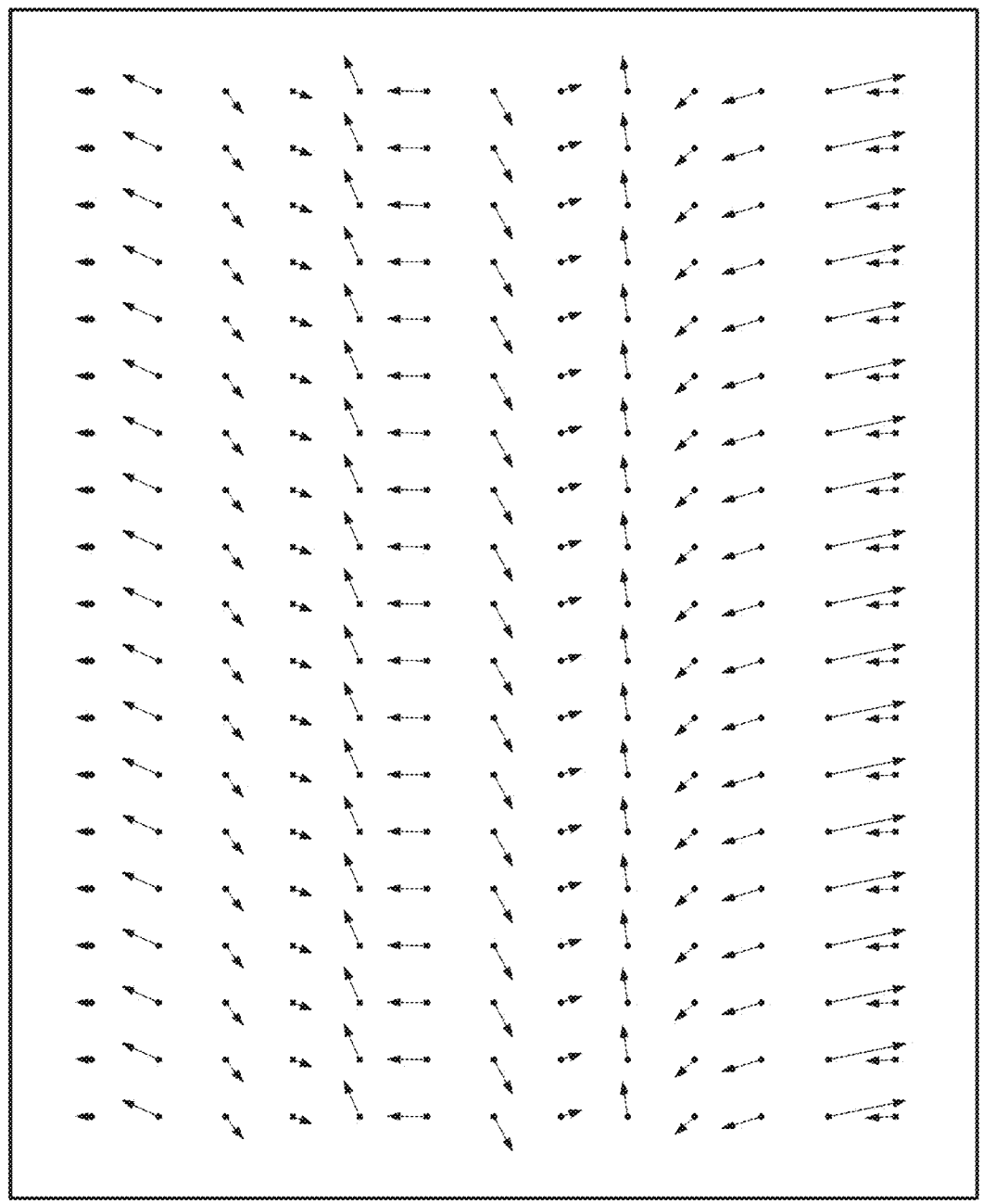
FIGS. 7A to 7E and 8A to 8E are diagrams that are provided to illustrate a step of fitting each of overlay components with a polynomial function, in the overlay correction method according to some example embodiments of inventive concepts.

FIG. 7A shows averaged overlay quantities for the 13 columns Col1-Col13. For example, first averaged overlay quantities are illustrated in columns of FIG. 7A, and the first averaged overlay quantity for each of the columns may have the same size and the same direction. The first averaged overlay quantities may represent averaged overlay quantities in a slit direction (e.g., in the first direction D1 of FIGS. 1 and 2); however, example embodiments are not limited thereto.

Figure 7B:
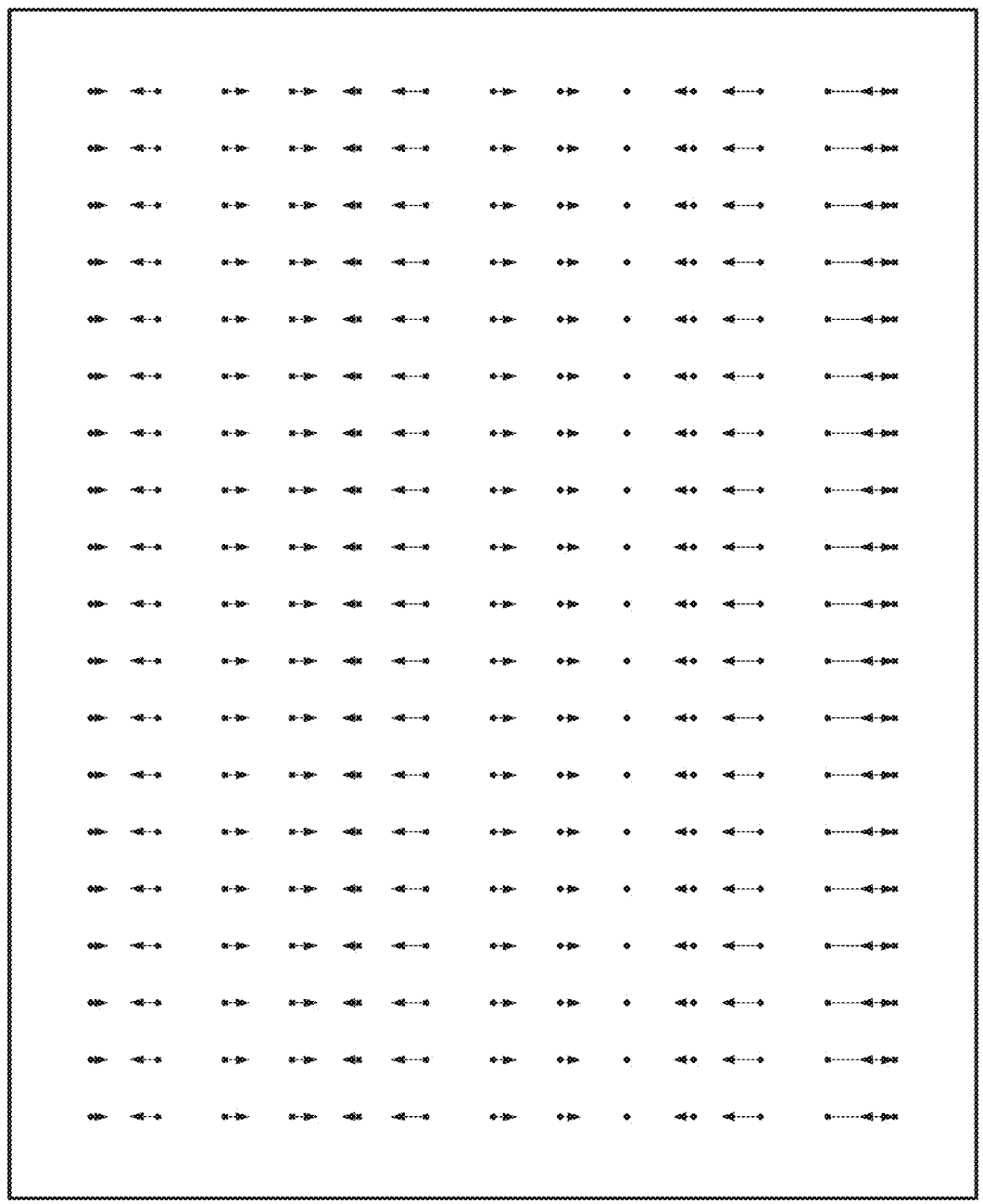
Figure 7C:
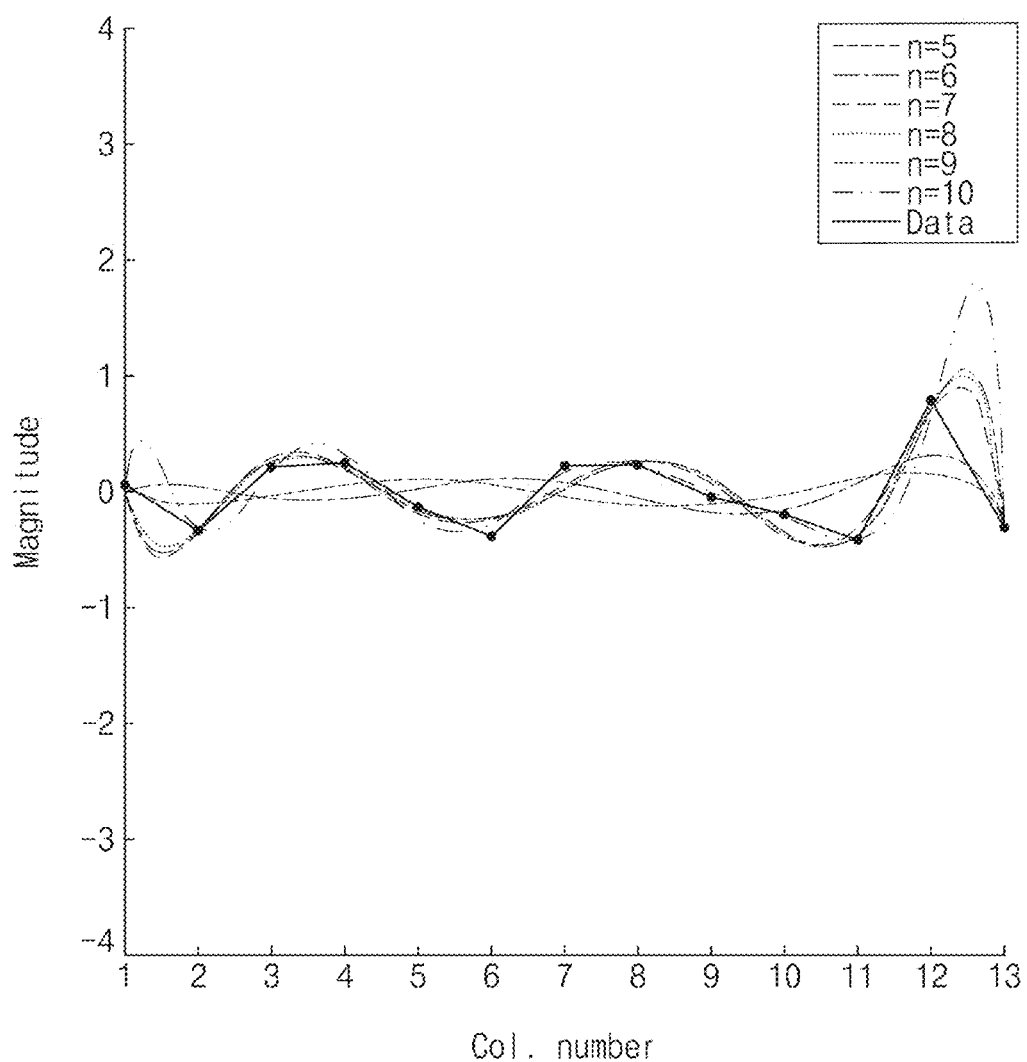

FIG. 7B represents x components of the first averaged overlay quantities shown in FIG. 7A, and FIG. 7C is graphs showing the x components of the first averaged overlay quantities shown in FIG. 7B and fitting curves plotted with polynomial functions. The direction of the x-axis may be a direction of the row.

The graphs in FIG. 7C are obtained by fitting the x components of the first averaged overlay quantities with the polynomial functions given by the following Equation 1.

$$f_1^n(x) = a_4 x^4 + a_5 x^5 + \ldots + a_n x^n \quad \text{[Equation 1]}$$

where $a_i$ (i=4, 5, n) is a coefficient of the i-th monomial term and n is the degree, or highest order of the polynomial function. As indicated in Equation 1, the $f_1^n(x)$ functions (n=5, 6, 7, 8, 9, 10) are polynomial functions having a monomial with a lowest order of 4.

For example, n, which is the degree/highest order of the polynomial function used for the fitting, may be determined based on the differences between the x components of the first averaged overlay quantities and the $f_1^n(x)$ functions, and the differences may be given by the following Equation 2.

$$d_n = \sum_{k=1}^{13} |c_{1,k} - f_1^n(k)| \quad \text{[Equation 2]}$$

where $c_{1,k}$ is the x component of the first averaged overlay quantity corresponding to a k-th column, and $d_n$ is a sum of the absolute value of differences between values of the components $c_{1,k}$ and the functions $f_1^n(x)$ at x=k. Although the sum only includes 13 terms, example embodiments are not limited thereto. Additionally, although dn is defined as a sum of absolute values of differences, example embodiments are not limited thereto, and dn may be defined as, for example, a root-mean-squared difference.

A value of n which gives the smallest value for the sum $d_n$ and/or corresponds to an inflection point in a graph of the value $d_n$ with respect to the index n given as the highest order/degree of the function $f_1^n(x)$ may be determined as/selected as the highest order/degree of the polynomial function which will be used for the fitting. The degree/highest order of the polynomial function, which will be used for the fitting, may be, for example, 8, 9, or 10.

As a non-limiting example embodiment, the difference dn may be a function used to choose a degree for overlay fitting. For example, n may vary between 8 and 10; a polynomial having a degree n may be fit (e.g. with a least-squares fitting) to the x-component of the overlay data, and a difference dn may be calculated as a sum of the absolute values of the difference between the polynomial function and the x-component of each overlay data over all columns. The coefficients ai may be determined by a least-squares fitting for each of n=8, 9, and 10. Thus there may be a separate difference do for n=8, 9, and 10. An n may be chosen that minimizes the differences, and/or that is associated with an inflection point among the differences.

Figure 7D:
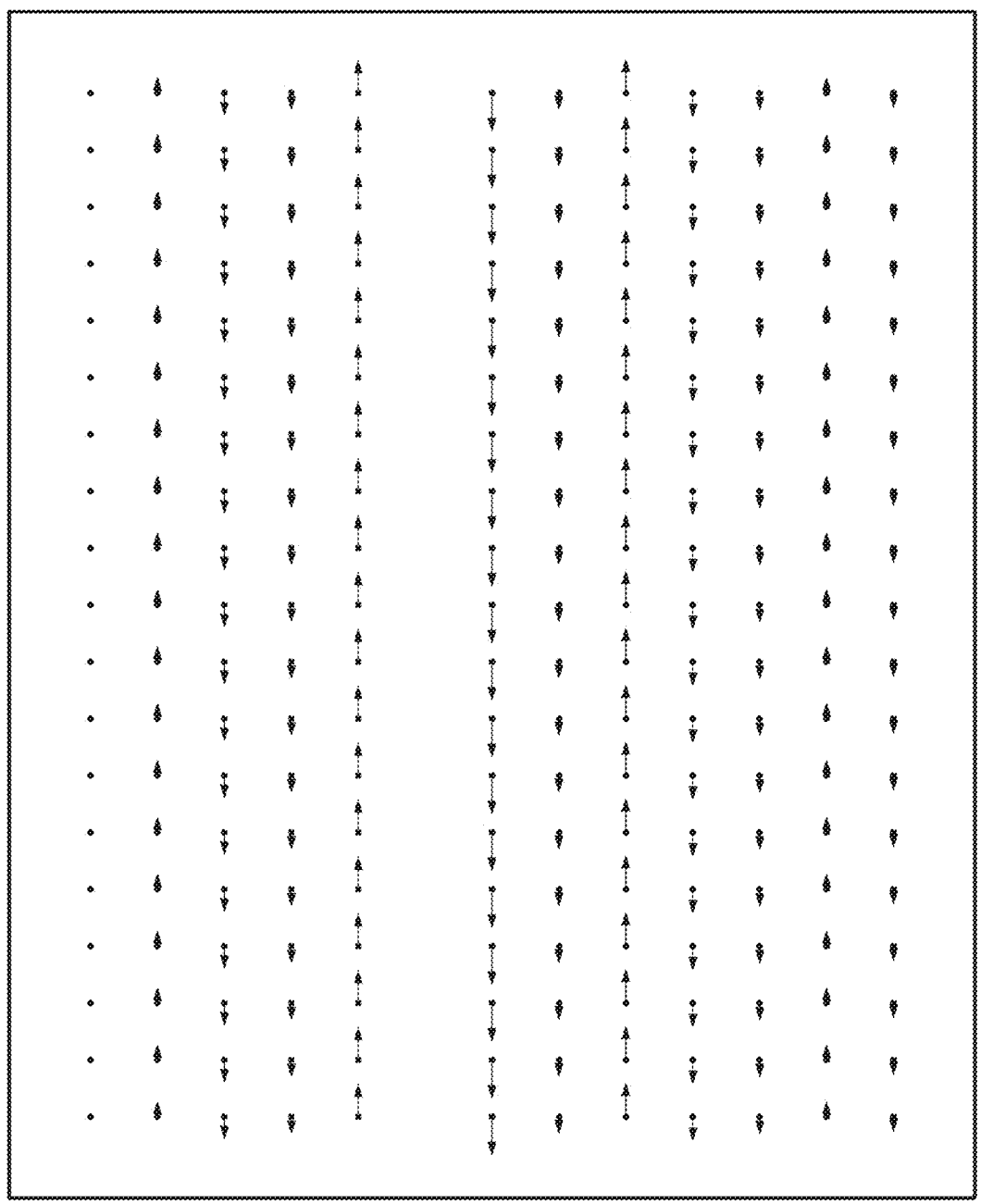
Figure 7E:
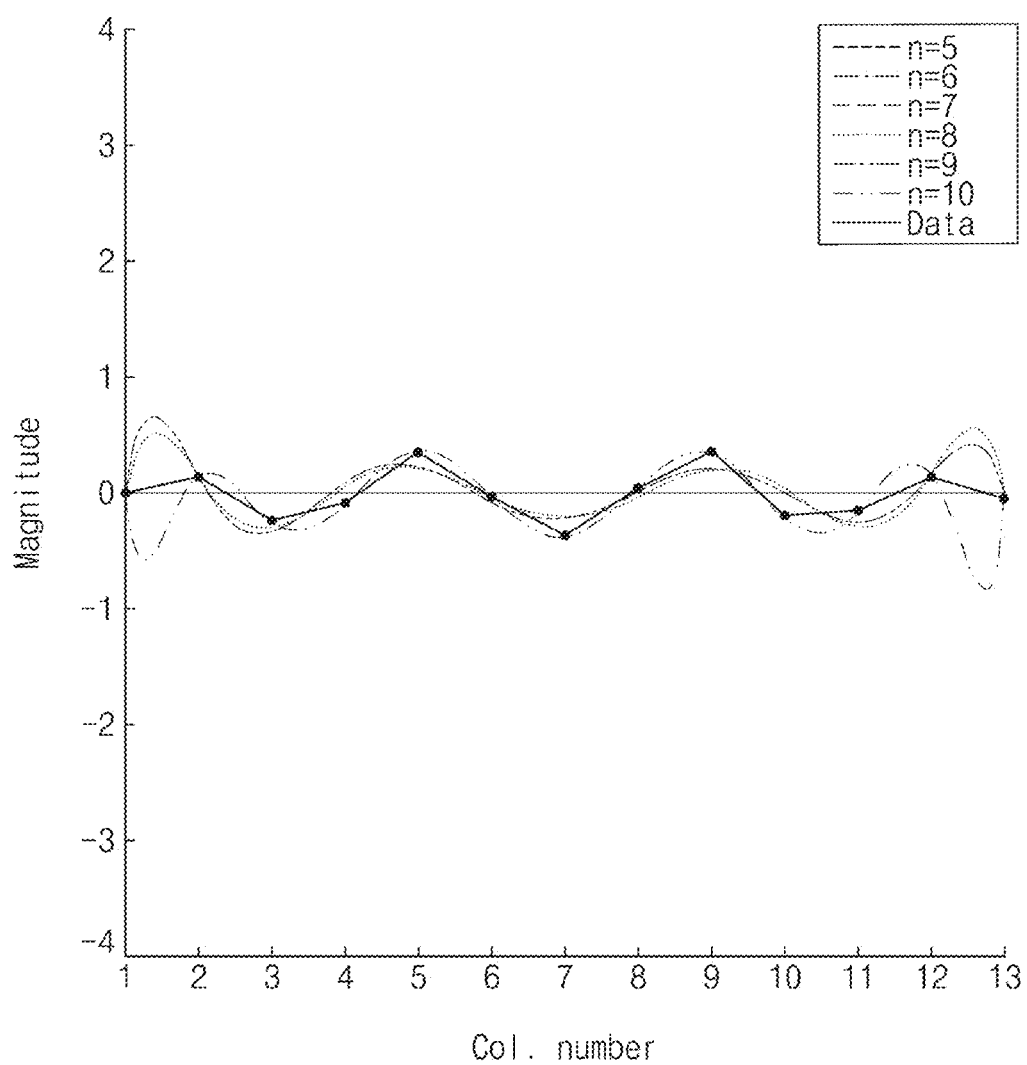

FIG. 7D represents y components of the first averaged overlay quantities shown in FIG. 7A, and FIG. 7E is graphs showing the y components of the first averaged overlay quantities shown in FIG. 7D and fitting curves plotted with polynomial functions. The direction of the y-axis may be a direction of the column.

The graphs in FIG. 7E may be obtained by fitting the y components of the first averaged overlay quantities with the polynomial functions given by the following Equation 3.

$$f_2^m(x) = b_4 x^4 + b_5 x^5 + \ldots + b_m x^m \quad \text{[Equation 3]}$$

where $b_i$ (i=4, 5, ... m) is a coefficient of the i-th term and, and m is the highest order of the function. The $f_2^m(x)$ functions (m=5, 6, 7, 8, 9, 10) are polynomial functions having a monomial with the lowest order of 4.

The degree/highest order of the polynomial function used for the fitting may be determined from the differences between the y components of the first averaged overlay quantities and the $f_2^m(x)$ functions, given by the following Equation 4.

$$d_m = \sum_{k=1}^{13} |c_{2,k} - f_2^m(k)| \quad \text{[Equation 4]}$$

where $c_{2,k}$ is the y component of the first averaged overlay quantity corresponding to the k-th column, and $d_m$ is a sum of differences between values of the components $c_{2,k}$ and the functions $f_2^m(x)$ at x=k. Although the sum only includes 13 monomial terms, example embodiments are not limited thereto. Additionally, although dm is defined as a sum of absolute values of differences, example embodiments are not limited thereto, and dm may be defined as, for example, a root-mean-squared difference.

An m value, which gives the smallest value for the sum $d_m$ and/or corresponds to an inflection point in a graph of the value dm with respect to an index m given as the highest order of the function $f_2'''(x)$, may be determined as the highest order of the polynomial function, which will be used for the fitting. The highest order of the polynomial function, which will be used for the fitting, may be, for example, 8, 9, or 10.

As a non-limiting example embodiment, the difference dm may be a function used to choose a degree for overlay fitting. For example, m may vary between 8 and 10; a polynomial having a degree m may be fit (e.g. with a least-squares fitting) to the y-component of the overlay data, and a difference dm may be calculated as a sum of the absolute values of the difference between the polynomial function and the y-component of each overlay data over all columns. The coefficients bi may be determined by a least-squares fitting for each of m=8, 9, and 10. Thus there may be a separate difference dm for m=8, 9, and 10. An m may be chosen that minimizes the differences, and/or that is associated with an inflection point among the differences.

Figure 8A:
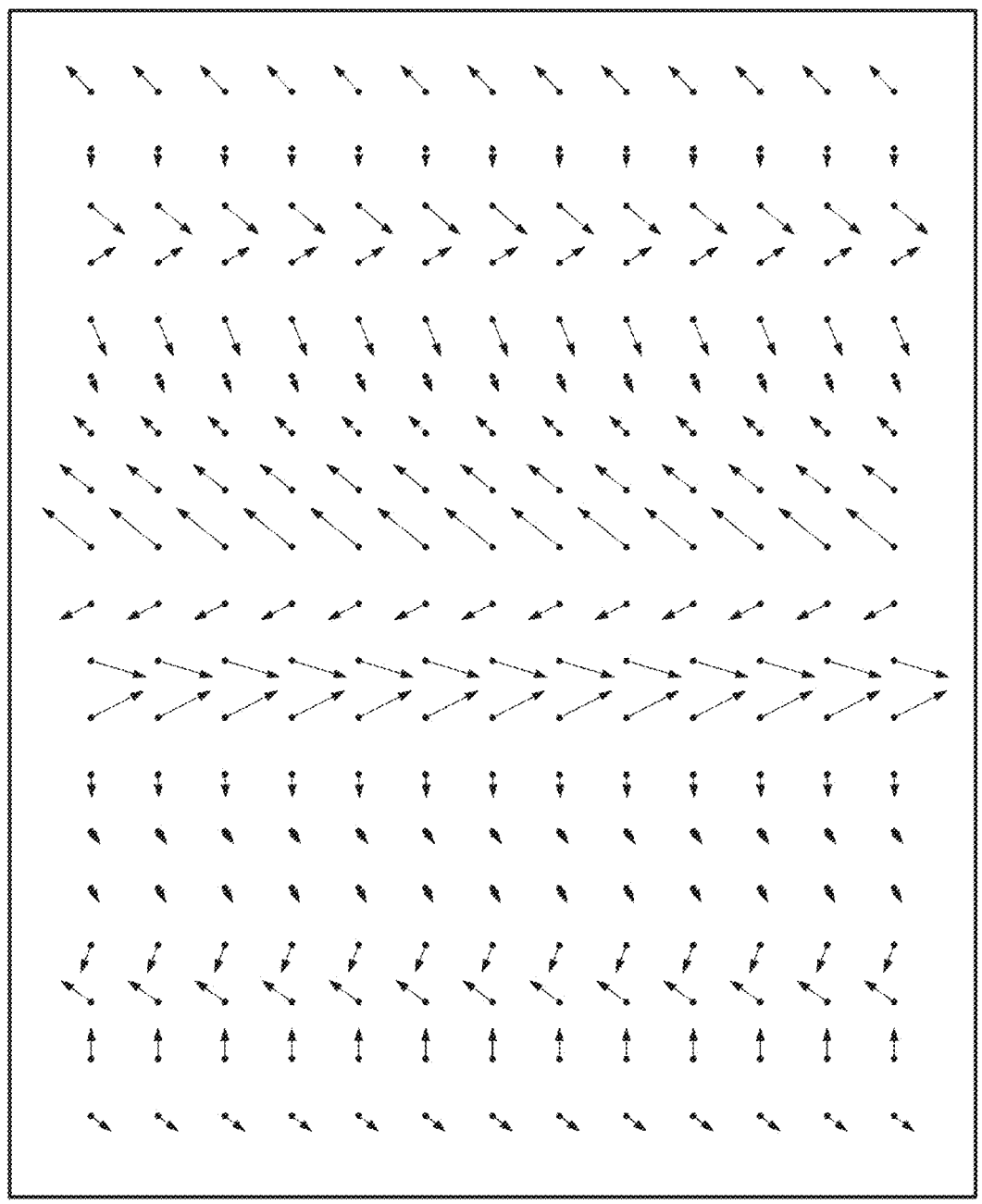

FIG. 8A shows averaged overlay quantities for the 19 rows Row1-Row19. For example, second averaged overlay quantities are illustrated in rows of FIG. 8A, and the second averaged overlay quantity for each of the rows may have the same size and the same direction. The second averaged overlay quantities may represent averaged overlay quantities in a scan direction (e.g., in the second direction D2 of FIGS. 1 and 2).

Figure 8B:
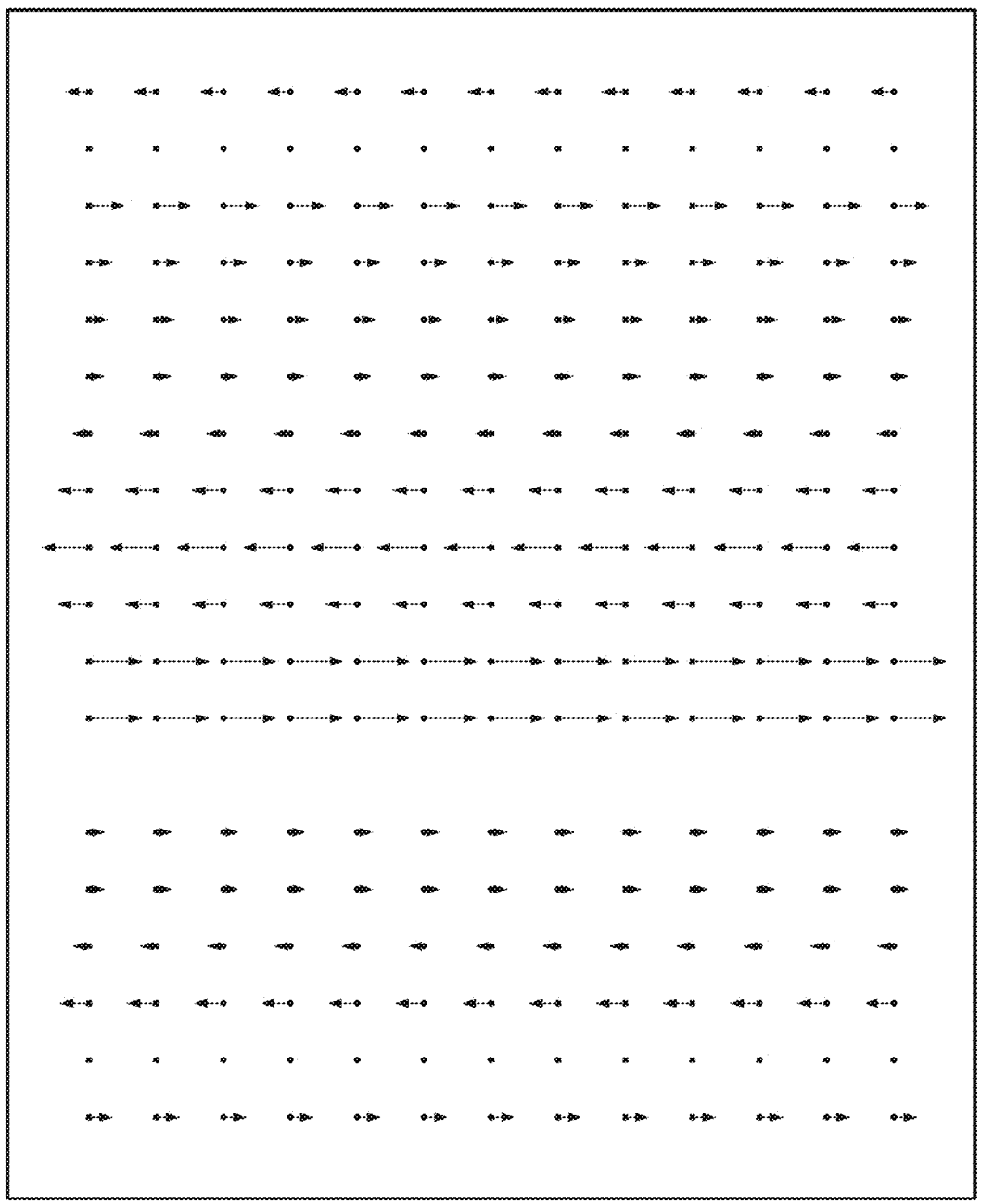
Figure 8C:
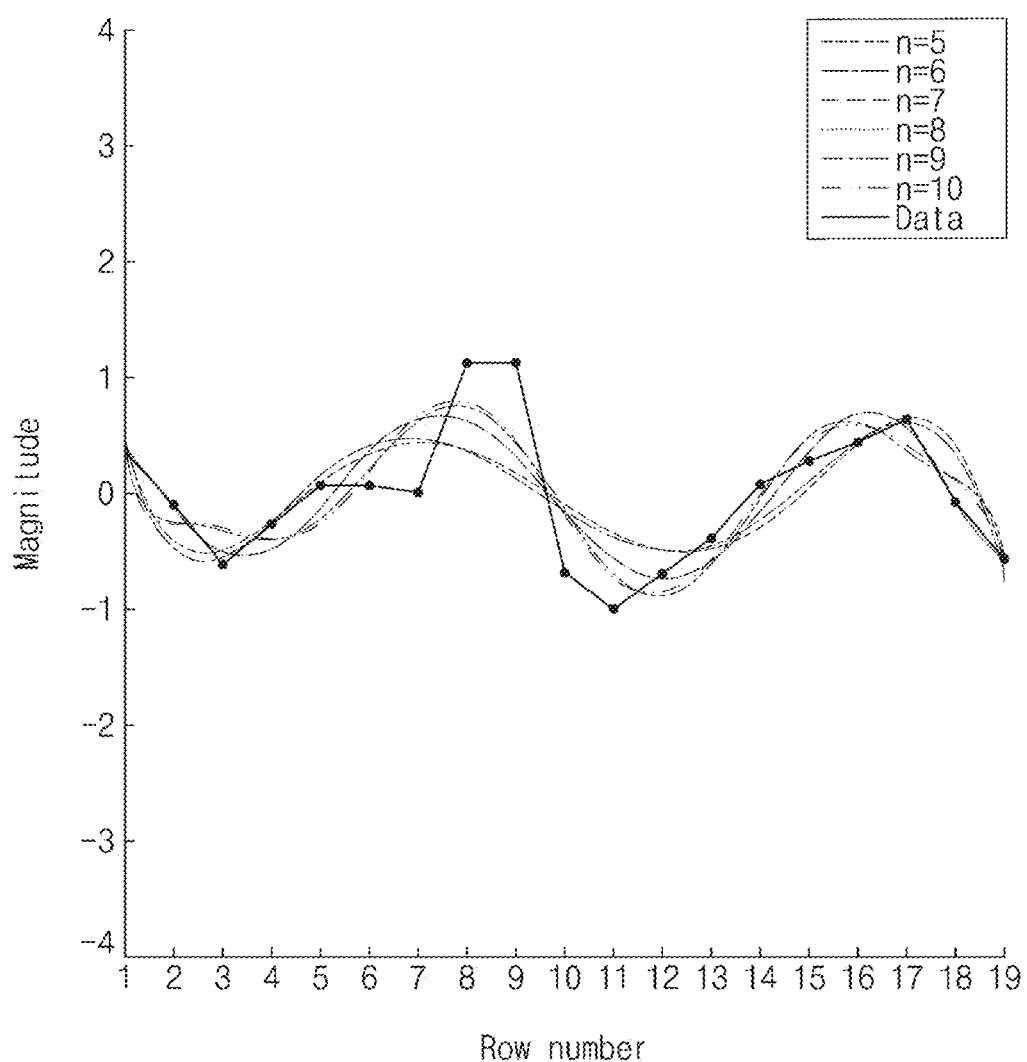

FIG. 8B represents x components of the second averaged overlay quantities shown in FIG. 8A, and FIG. 8C is graphs showing the x components of the second averaged overlay quantities shown in FIG. 8B and fitting curves plotted with polynomial functions. The direction of the x-axis may be a direction of the row; however, example embodiments are not limited thereto.

Figure 8D:
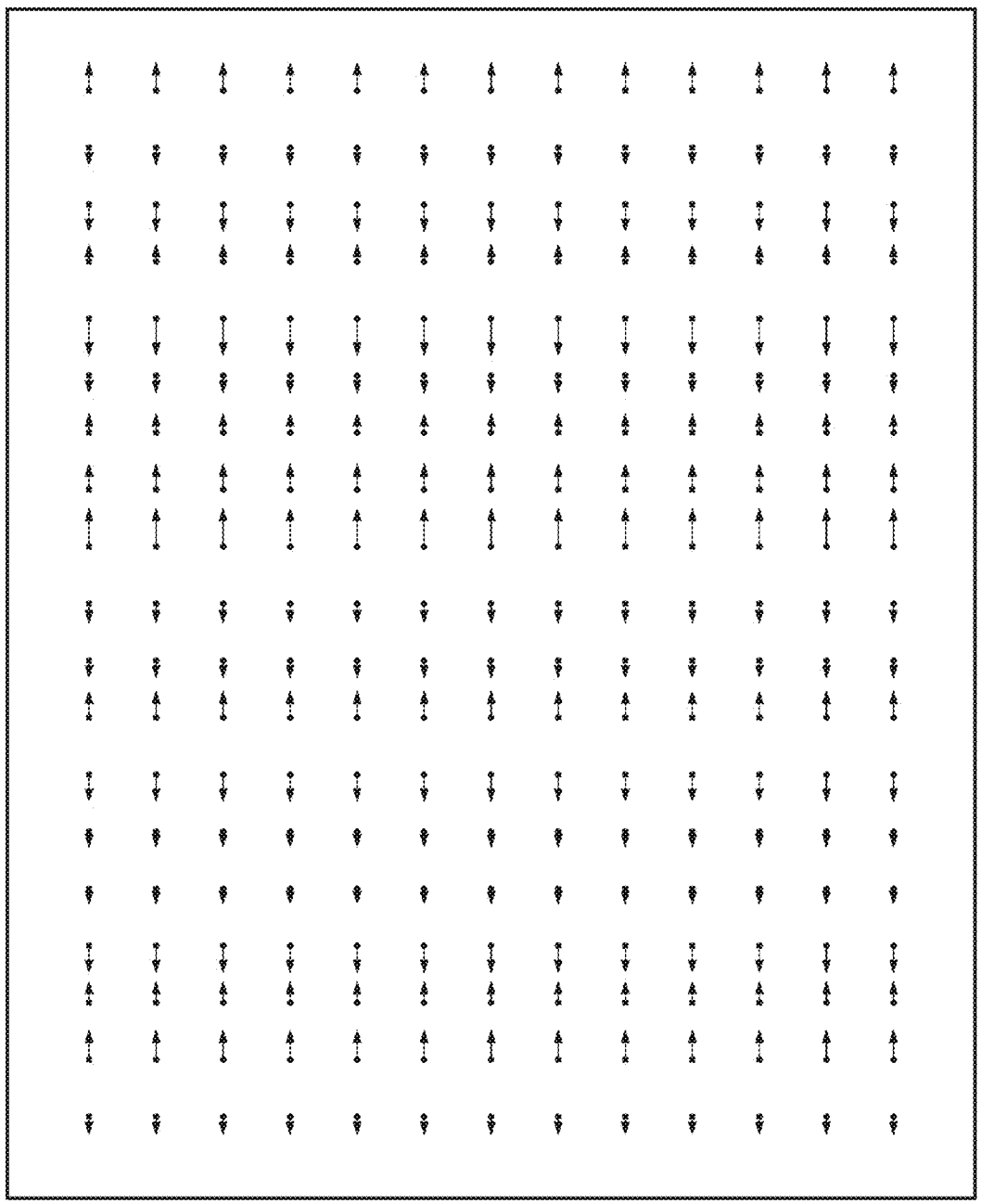
Figure 8E:
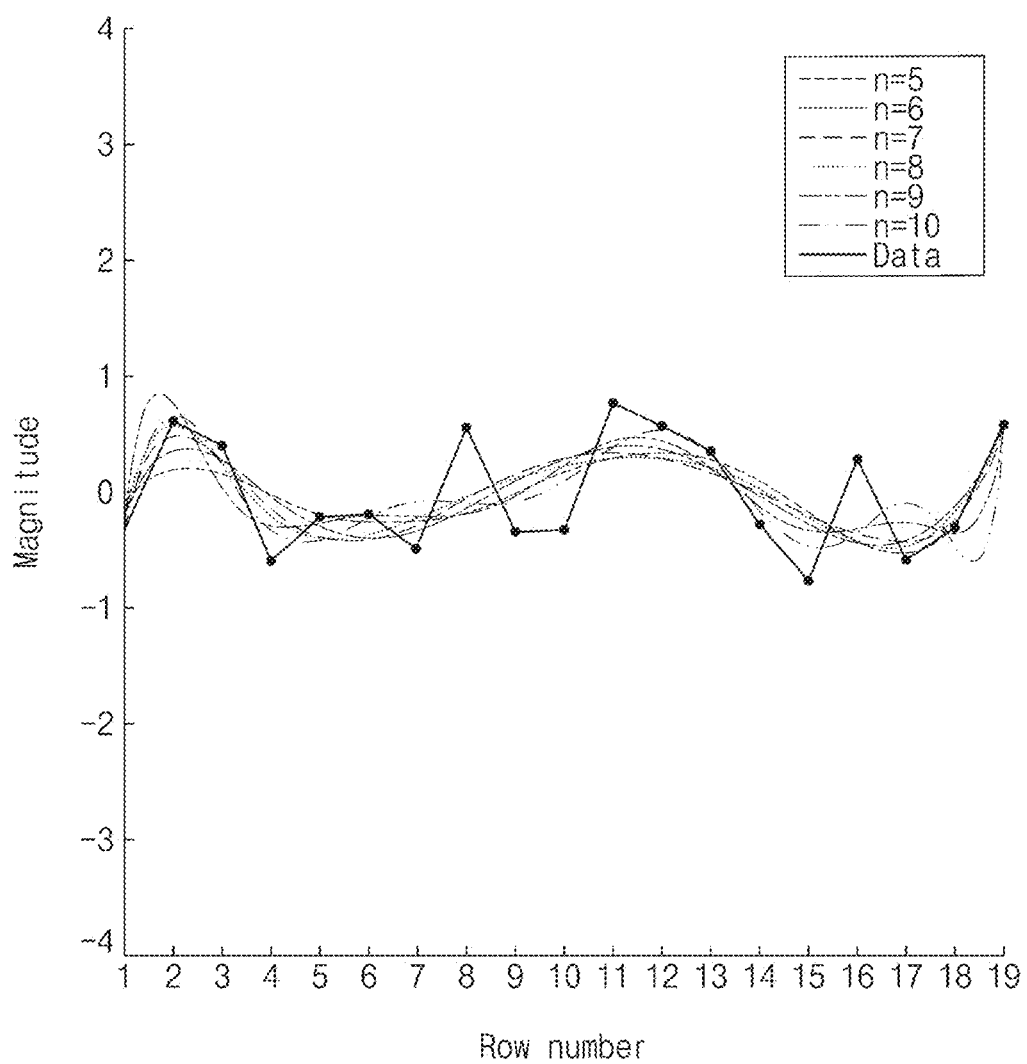

FIG. 8D represents y components of the second averaged overlay quantities shown in FIG. 8A, and FIG. 8E is the y components of the second averaged overlay quantities shown in FIG. 8D and fitting curves plotted with polynomial functions. The direction of the y-axis may be a direction of the column; however, example embodiments are not limited thereto.

In FIGS. 8C and 8E, the degree, or the highest order of the polynomial function which will be used for the fitting, may be determined in substantially the same manner as previously described with reference to FIGS. 7C and 7E.

Thereafter, the correction model may be constructed by summing first fitting quantities whose degree/highest order is determined in the same manner as described with reference to FIGS. 7C, 7E, 8C, and 8E (in S30 of FIG. 3). In addition, a reticle may be manufactured based on the correction model (in S40 of FIG. 3), and then the overlay may be corrected using such a reticle (in S50 of FIG. 3). In some example embodiments, the reticle may be manufactured by, for example, an electron beam lithography process, based on the correction model. A semiconductor device may be fabricated based on the reticle.

According to the overlay correction method, a 3σ value of the overlay quantities is reduced as described in the following [Table 1], where σ is a standard deviation.

TABLE 1

| | 3σ value before correction | 3σ value after correction |
|---|---|---|
| Slit direction | 1.39 | 0.98 (reduced by about 29.5%) |
| Scan direction | 1.44 | 1.03 (reduced by about 28.5%) |

More specifically, in the overlay correction method according to some example embodiments, a 3σ value of the overlay quantities in the slit direction may be reduced by about 29.5%, and another 3σ value of the overlay quantities in the scan direction may be reduced by about 28.5%. The mean of the 3σ value of the overlay quantities in the slit direction and the 3σ value of the overlay quantities in the scan direction may be reduced by about 29%. In a case where only the x components in the slit direction are corrected by a conventional correction method, the 3σ value may be reduced by about 8.1%, whereas in the overlay correction method according to some example embodiments of inventive concepts, it may be possible to correct components of terms of higher order, beyond the correction ability of the exposure apparatus, and thereby to minimize or reduce the impact of a misalignment issue in patterns, which are formed on a wafer.

Figure 9:
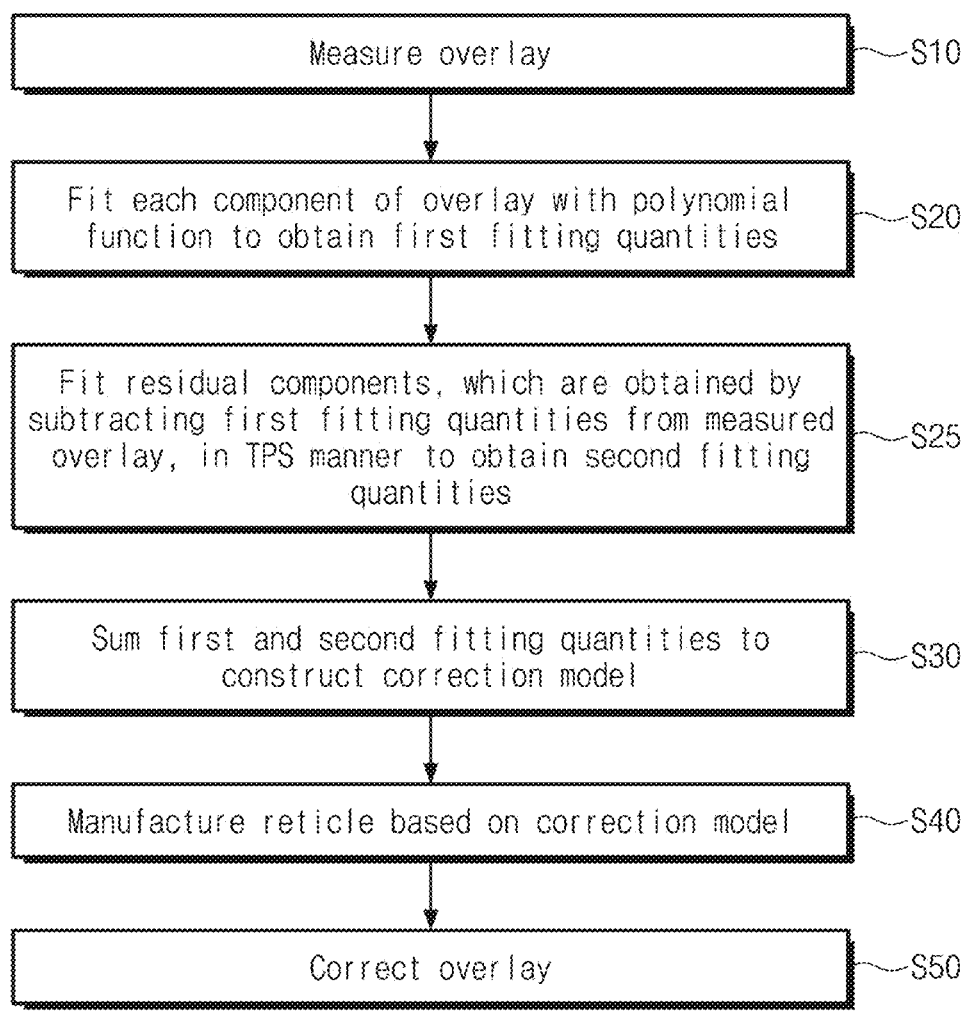
FIG. 9 is a flow chart illustrating an overlay correction method according to some example embodiments of inventive concepts.

FIG. 9 is a flow chart illustrating an overlay correction method according to some example embodiments of inventive concepts. For the sake of brevity, the elements and features of this embodiment that are similar to those previously shown and described will not be described in much further detail.

Referring to FIG. 9, the overlay correction method may further include fitting residual components which are obtained by subtracting the first fitting quantities from the measured overlay, in a thin plate spline (TPS) manner (in S25), in addition to the afore-described steps S10, S20, S30, S40, S50, and S60 of FIG. 3.

The TPS fitting may be or may correspond to a fitting method, which is performed using a curved surface defined by combined basis functions, and here, since the basis functions can be locally modified, the formation of the entire curved surface may be determined through a combination thereof. The basis functions may be, for example, polynomial functions.

The TPS fitting of the residual components (in S25) may be performed between the fitting step (in S20) and the constructing of the correction model (in S30). The constructing of the correction model (in S30) may be performed in such a way to sum not only the first fitting quantities, but also second fitting quantities, which are obtained by the TPS fitting, unlike that described with reference to FIG. 3.

Figure 10:
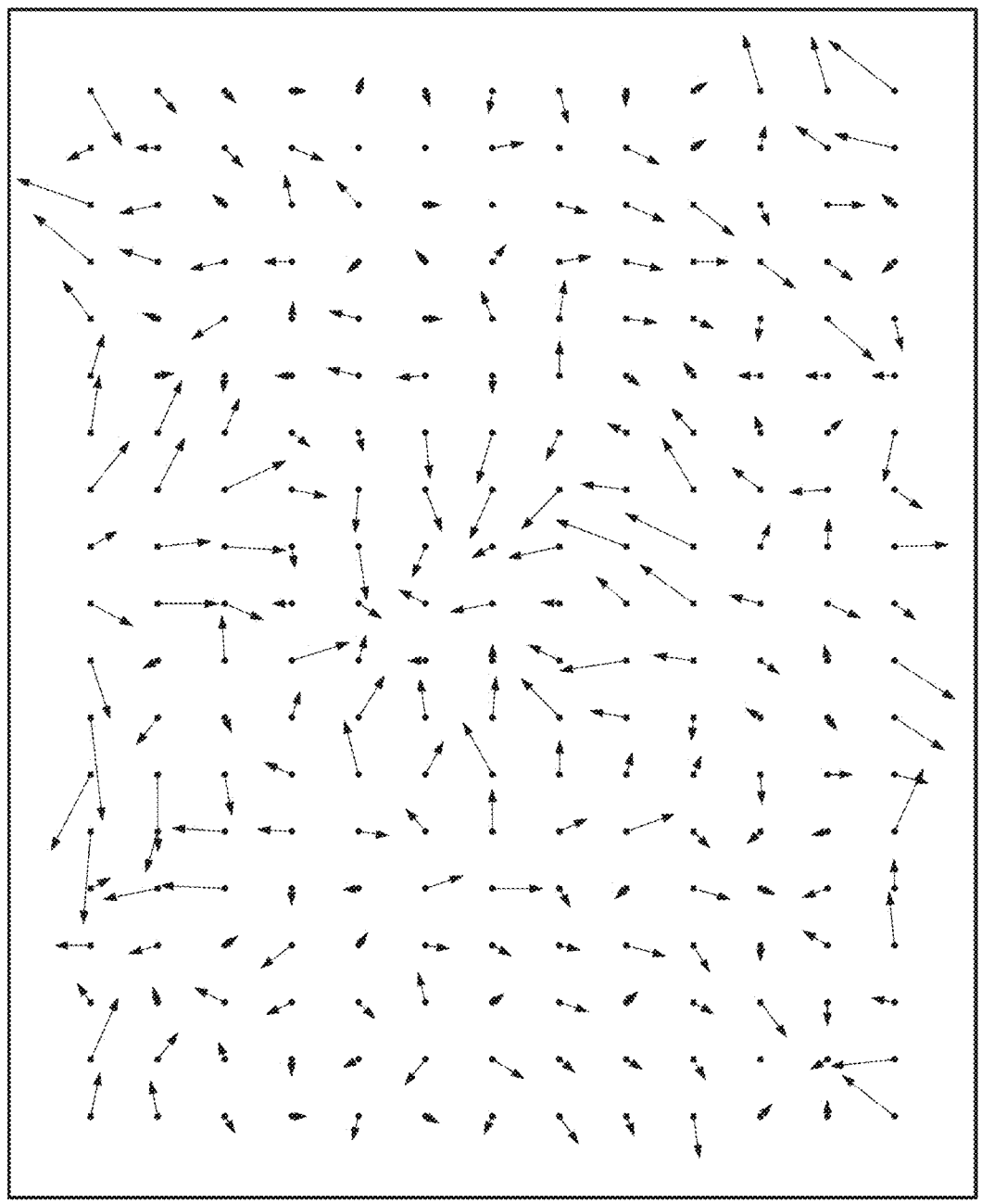
FIGS. 10 and 11 are diagrams that are provided to illustrate a step of fitting residual components obtained by subtracting a first fitting quantity, which is fitted with a polynomial function, from the measured overlay, in the overlay correction method according to some example embodiments of inventive concepts.
Figure 11:
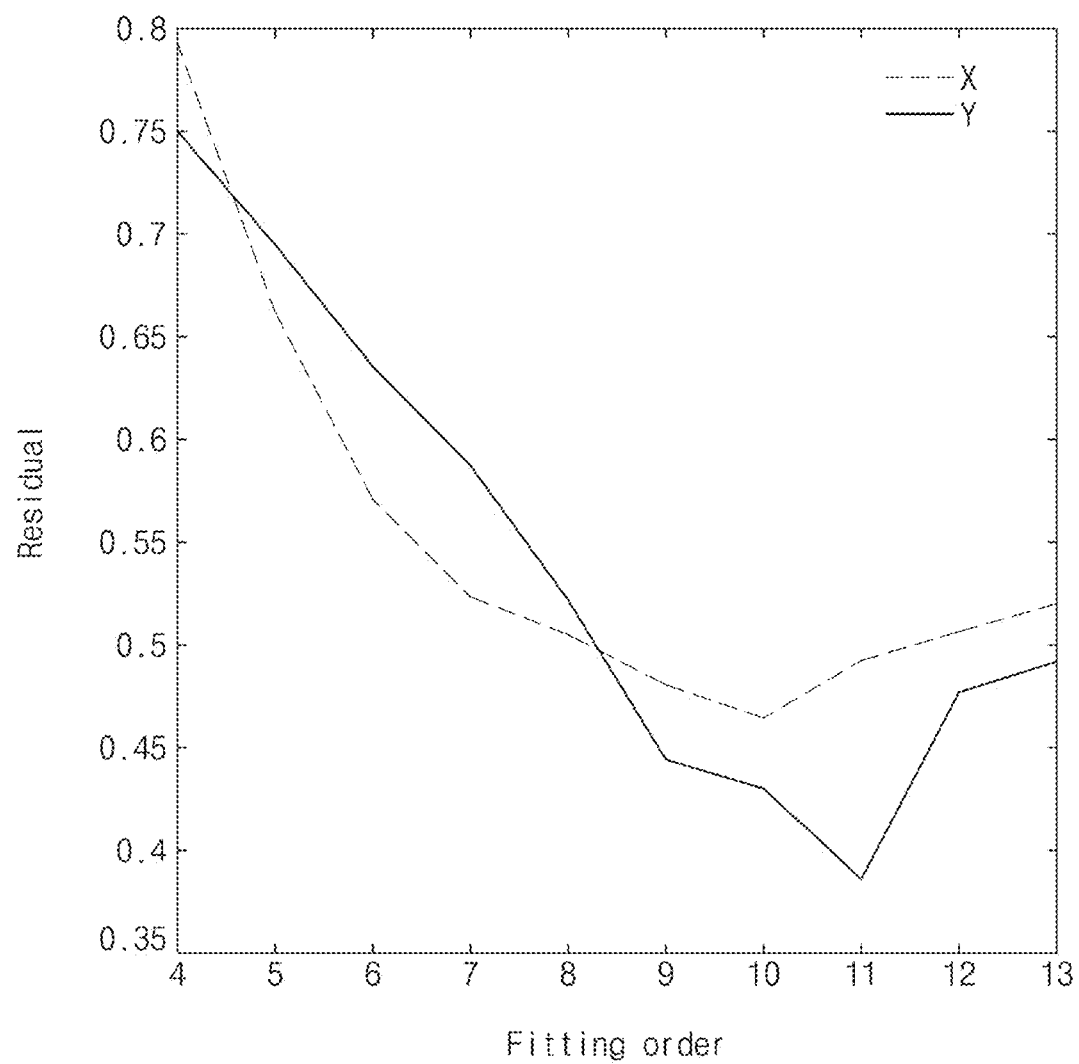

FIGS. 10 and 11 are diagrams that are provided to illustrate a step of fitting the residual components obtained by subtracting the first fitting quantities from the measured overlay, in the overlay correction method according to some example embodiments of inventive concepts.

FIG. 10 illustrates residual components, which are obtained by subtracting the first fitting quantities whose highest order is determined in the same manner as described with reference to FIGS. 7C, 7E, 8C, and 8E, from the overlay quantities of FIG. 6. FIG. 11 is a graph showing a value of the residual overlay quantity with respect to the fitting order of the basis functions used for the TPS fitting. Here, the residual overlay quantity may be defined as a value that is obtained by subtracting the second fitting quantities from the residual components of FIG. 10 and may include x and y components.

Referring to FIG. 11, the highest order of the basis functions used for the TPS fitting may be determined as a value giving the smallest value for the residual overlay quantity. For example, the highest order of the basis functions used for the TPS fitting may be 10 or 11.

Figure 12:
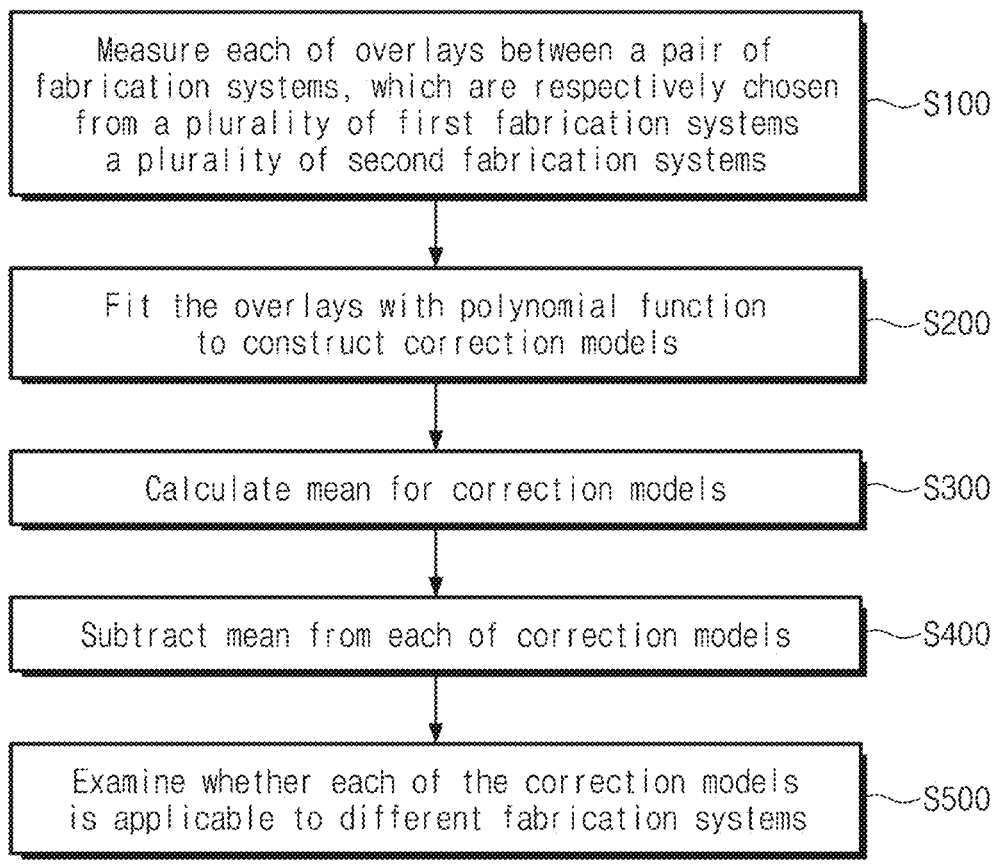
FIG. 12 is a flow chart illustrating a method of evaluating an overlay correction operation according to some example embodiments of inventive concepts.
Figure 13:
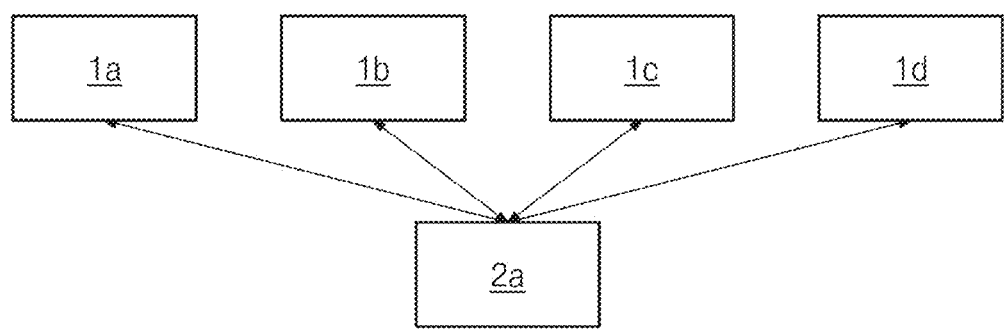
FIGS. 13 and 14 are conceptual diagrams illustrating a method of evaluating an overlay correction operation according to some example embodiments of inventive concepts.
Figure 14:
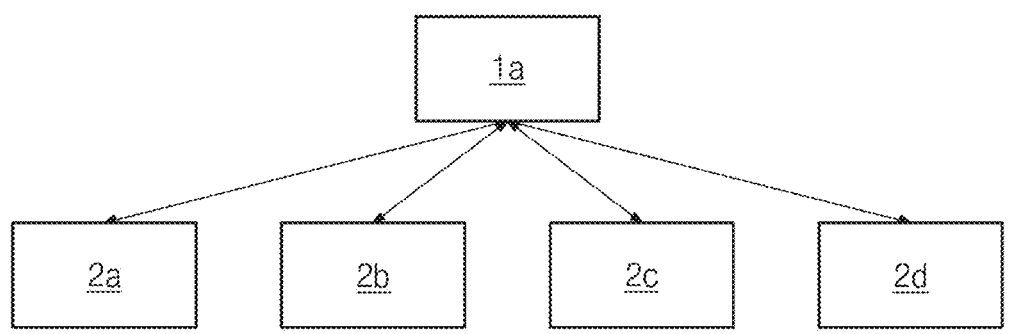

FIG. 12 is a flow chart illustrating a method of evaluating an overlay correction operation according to some example embodiments of inventive concepts. FIGS. 13 and 14 are conceptual diagrams illustrating a method of evaluating an overlay correction operation according to some example embodiments of inventive concepts.

Referring to FIGS. 12 to 14, the method of evaluating an overlay correction operation may include measuring each of overlays between a plurality of first fabrication systems 1a, 1b, 1c, and 1d and one (e.g., 2a) of second fabrication systems 2a, 2b, 2c, and 2d (e.g., shown in FIG. 13) or between one (e.g., 1a) of the first fabrication system and the plurality of second fabrication systems 2a, 2b, 2c, and 2d (e.g., shown in FIG. 14) (in S100), fitting components of each of the overlays with a polynomial function to construct correction models, using substantially the same method described with reference to FIGS. 3 to 6, 7A to 7E, and 8A to 8E (in S200), calculating a measure of central tendency for the correction models (in S300), subtracting the mean from each of the correction models (in S400), andevaluating whether each of the correction models can be applied for different fabrication systems (in S500). The measure of central tendency may be or may correspond to at least one of an arithmetic mean, a median, a mode, a geometric mean, or a harmonic mean; however, example embodiments are not limited thereto.

For example, the measuring of each of the overlays (in S100) may be performed to respectively measure overlays of lower patterns, which are respectively formed on a plurality of wafers by the first fabrication systems 1a, 1b, 1c, and 1d, and upper patterns, which re respectively formed on the lower patterns by the second fabrication systems 2a, 2b, 2c, and 2d, from the plurality of wafers provided with the lower and upper patterns.

The evaluation of the correction models (in S500) may be performed in such a way to compare values, which are obtained by subtracting the mean from the correction models, respectively.

Referring to FIG. 13, a value, which is obtained by subtracting a measure of central tendency from a correction model between the second fabrication system 2a and one (e.g., 1a) of the first fabrication systems 1a, 1b, 1c, and 1d, may be compared with a value, which is obtained by subtracting a measure of central tendency from a correction model between the second fabrication system 2a and another one (e.g., 1b) of the first fabrication systems 1a, 1b, 1c, and 1d, and in this case, if a difference between the values is smaller than a specific value, the correction model between the fabrication systems 1a and 2a may be evaluated to be applicable to the fabrication systems 1b and 2a$_4$.

Similarly, referring to FIG. 14, a value, which is obtained by subtracting a measure of central tendency from a correction model between the first fabrication system 1a and one (e.g., 2a) of the second fabrication systems 2a, 2b, 2c, and 2d, may be compared with a value, which is obtained by subtracting a measure of central tendency from a correction model between the first fabrication system 1a and another one (e.g., 2b) of the second fabrication systems 2a, 2b, 2c, and 2d, and in this case, if a difference between the values is smaller than a specific value, the correction model between the first fabrication system 1a and one (e.g., 2a) of the second fabrication systems 2a, 2b, 2c, and 2d may be evaluated to be applicable to the first fabrication system 1a and another one (e.g., 2b) of the second fabrication systems 2a, 2b, 2c, and 2d.

In the method of evaluating an overlay correction operation according to some example embodiments of inventive concepts, it may be possible to evaluate whether a correction model between a pair of fabrication systems can be applicable to another pair of fabrication systems, and thereby to reduce cost and/or time required to fabricate a semiconductor device.

Figure 15:
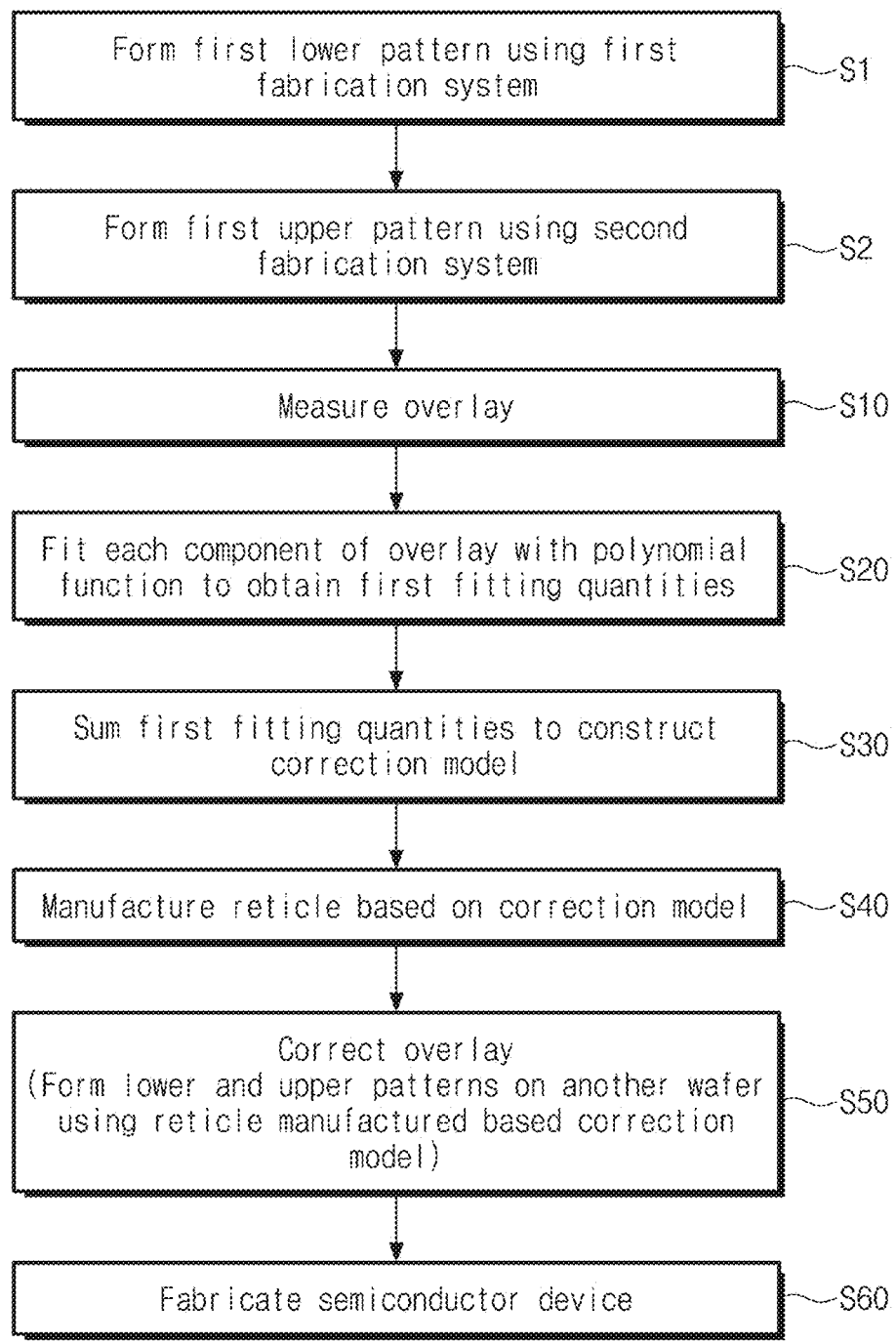
FIG. 15 is a flow chart illustrating a method of fabricating a semiconductor device using an overlay correction method according to some example embodiments of inventive concepts.

FIG. 15 is a flow chart illustrating a method of fabricating a semiconductor device using an overlay correction method according to some example embodiments of inventive concepts.

Referring to FIGS. 1, 2, and 15, the method of fabricating a semiconductor device according to the present embodiment may include forming a first lower pattern on a first wafer using the first fabrication system 1 (in S1), forming a first upper pattern on the first lower pattern using the second fabrication system 2 (in S2), measuring an overlay between the first lower pattern and the first upper pattern (in S10), fitting each component of the overlay with a polynomial function to obtain first fitting quantities (in S20), summing the first fitting quantities to construct a correction model (in S30), manufacturing a reticle based on the correction model (in S40), correcting the overlay (in S50), and fabricating a semiconductor device based on the correction model (S60).

Furthermore, in the method of fabricating a semiconductor device, a step of fitting the residual components, which are obtained by subtracting the first fitting quantities from the measured overlay in the thin plate spline (TPS) manner (e.g., S25 of FIG. 9), may be further performed between the fitting of each component of the overlay with a polynomial function (in S20) and the constructing of the correction model (in S30).

In detail, the correcting of the overlay (in S50) may include forming a second lower pattern and a second upper pattern on a second wafer, which is different from the first wafer, using the reticle, which is manufactured based on the correction model. A semiconductor device may then be fabricated based on the correction of the overlay (S60).

In the method of fabricating a semiconductor device using the overlay correction method, since the reticle is manufactured based on the fitted overlay quantities, it may be possible to reduce cost and/or time required to fabricate a semiconductor device.

In an overlay correction method according to some example embodiments of inventive concepts, it may be possible to correct components of terms of fourth or higher order, beyond correction ability of an exposure apparatus, and thereby to minimize or reduce a misalignment issue in patterns, which are formed on a wafer.

In a method of evaluating an overlay correction operation according to some example embodiments of inventive concepts, it may be possible to evaluate whether a correction model between a pair of fabrication systems can be applicable to another pair of fabrication systems and thereby to reduce cost and/or time required to fabricate a semiconductor device.

In a method of fabricating a semiconductor device using an overlay correction method according to some example embodiments of inventive concepts, since a reticle is manufactured based on the fitted overlay quantities, it may be possible to reduce cost and/or time required to fabricate a semiconductor device.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

While some example embodiments of inventive concepts have been particularly shown and described, it will be understood by one of ordinary skill in the art that variations in form and detail may be made therein without departing from the spirit and scope of the attached claims.

What is claimed is:

1. An overlay correction method, comprising:
measuring an overlay between a center line of a lower pattern on a wafer and a center line of an upper pattern on the lower pattern;
fitting each of components of the overlay with a polynomial function to obtain first fitting quantities; and
summing the first fitting quantities to construct a correction model,
wherein the components of the overlay include overlay components in a first direction parallel to a top surface of a reticle, and overlay components in a second direction parallel to the top surface of the reticle and intersecting the first direction, and at least one of
a degree of the polynomial function corresponds to an order which minimizes an absolute value of a difference between the polynomial function and each of the components of the overlay, or
the degree of the polynomial function corresponds to an inflection point in a graph of the difference with respect to the degree of the polynomial function.

2. The method of claim 1, wherein the polynomial function corresponds to a sum of a plurality of monomial functions, and a monomial function included in the plurality of monomial functions having the lowest degree is of degree 4.

3. The method of claim 1, wherein the measuring of the overlay comprises measuring a displacement vector between the center line of the lower pattern and the center line of the upper pattern.

4. The method of claim 1, wherein each of the overlay components in the first and second directions corresponds to a vector quantity comprising x components and y components, and
the fitting of the components of the overlay with the polynomial function comprises fitting each of the x components and y components with the polynomial function.

5. The method of claim 1, wherein the reticle is manufactured by an electron beam lithography process, the electron beam lithography process based on the correction model.

6. The method of claim 1, further comprising:
fitting residual components to obtain second fitting quantities, the residual components obtained by subtracting the first fitting quantities from the measured overlay, the subtracting being in a thin plate spline (TPS) manner.

7. The method of claim 6, wherein the TPS fitting is performed between the fitting of each of the components of the overlay with the polynomial function and the constructing of the correction model, and
the constructing of the correction model is performed in such a way to sum the first fitting quantities and the second fitting quantities.

8. The method of claim 6, wherein the TPS fitting is a fitting method performed using a curved surface defined by combined basis functions.

9. A method of evaluating an overlay correction operation, comprising:
measuring overlays between lower patterns and upper patterns of each of a plurality of wafers, the lower patterns formed on the wafers by using a plurality of first fabrication processes, the upper patterns formed on the lower patterns by a plurality of second fabrication processes;
fitting components of each of the overlays with a polynomial function to obtain first fitting quantities and construct correction models;
calculating a measure of central tendency for the correction models;
subtracting the measure of central tendency from each of the correction models; and
determining whether each of the correction models is applicable to a pair of fabrication processes, which are respectively chosen from the first fabrication processes and the second fabrication processes,
wherein the evaluating of the correction models comprises comparing values, respectively obtained by subtracting the measure of central tendency from the correction models, and
the components of each of the overlays comprise overlay components in a first direction parallel to a top surface of a reticle provided in each of the fabrication processes, and overlay components in a second direction parallel to the top surface of the reticle and intersects the first direction.

10. The method of claim 9, wherein each of the first fabrication processes comprises using a laser light source which is configured to emit at least one of a G-line, I-line, KrF, ArF, or F2 laser light, and
each of the second fabrication processes comprises using a light source which is configured to emit extreme ultraviolet (EUV) light whose center wavelength ranges from about 4 nm to 20 nm.

11. The method of claim 9, wherein a degree of the polynomial function corresponds to an order which minimizes an absolute value of a difference between the polynomial function and each component of each of the overlays, or
the degree of the polynomial function corresponds to an inflection point in a graph of the difference with respect to the degree of the polynomial function.

12. The method of claim 9, further comprising:
fitting residual components to obtain second fitting quantities, the residual components obtained by subtracting the first fitting quantities from the measured overlays in a thin plate spline (TPS) manner,
wherein the TPS fitting is performed between the fitting of each component of each of the overlays with the polynomial function and the constructing of the correction models, and
the constructing of the correction models is performed in such a way to sum the first fitting quantities and the second fitting quantities.

13. The method of claim 9, wherein a pitch of the upper patterns is less than a pitch of the lower patterns.

14. A method of fabricating a semiconductor device, comprising:
- preparing a first wafer including a first lower pattern and a first upper pattern, which are formed using a first fabrication process and a second fabrication process, respectively;
- measuring an overlay between the first lower pattern and the first upper pattern, the measuring on the first wafer;
- fitting each of components of the overlay with a polynomial function to obtain first fitting quantities;
- summing the first fitting quantities to construct a correction model;
- manufacturing a reticle based on the correction model; and
- forming a second lower pattern on a second wafer and a second upper pattern on the second wafer, the second lower pattern and the second upper patterned formed using the reticle,
- wherein the components of the overlay comprise overlay components in a first direction parallel to a top surface of the reticle, and overlay components in a second direction parallel to the top surface of the reticle and intersecting the first direction.

15. The method of claim 14, wherein a degree of the polynomial function corresponds to an order which minimizes an absolute value of a difference between the polynomial function and each of the components of the overlay, or
the degree of the polynomial function corresponds to an inflection point in a graph of the difference with respect to degree of the polynomial function.

16. The method of claim 14, wherein a pitch of the first upper pattern or the second upper pattern is smaller than a pitch of the first lower pattern or is smaller than a pitch of the second lower pattern.

17. The method of claim 14, wherein the first upper pattern or the second upper pattern is formed to have a pitch of 45 nm or less.

18. The method of claim 14, wherein the first fabrication process comprises using a laser light source, which is configured to emit at least one of G-line, I-line, KrF, ArF, or F2 laser light, and
the second fabrication process comprises using a light source which is configured to emit extreme ultraviolet (EUV) light whose center wavelength ranges from about 4 nm to 20 nm.

19. The method of claim 18, wherein the second fabrication process includes a system including:
- an EUV emitter including the light source, which is configured to emit the EUV light;
- a delivery part configured to deliver the EUV light from the light source to the reticle;
- a projection part configured to project a fraction of the EUV light, which is reflected by the reticle, onto a region of the first wafer or the second wafer in a reduction manner;
- a reticle stage configured to support the reticle;
- a wafer stage configured to support at least one of the first wafer or the second wafer; and
- a control circuitry configured to at least one of control or drive the light source, the reticle stage, and the wafer stage, and
wherein the reticle is a reflection-type mask.

20. The method of claim 14, further comprising:
fitting residual components to obtain second fitting quantities, the residual components obtained by subtracting the first fitting quantities from the measured overlay in a thin plate spline (TPS) manner,
wherein the TPS fitting is performed between the fitting of each of the components of the overlay with the polynomial function and the constructing of the correction model, and
the constructing of the correction model is performed in such a way to sum the first fitting quantities and the second fitting quantities.

* * * * *